United States Patent
Nakanishi et al.

(10) Patent No.: US 7,710,175 B2
(45) Date of Patent: May 4, 2010

(54) PULSE WIDTH MODULATION CIRCUIT AND SWITCHING AMPLIFIER USING THE SAME

(75) Inventors: Yoshinori Nakanishi, Neyagawa (JP); Mamoru Sekiya, Neyagawa (JP)

(73) Assignee: ONKYO Corporation, Neyagawa-shi (JP)

( * ) Notice: Subject to any disclaimer, the term of this patent is extended or adjusted under 35 U.S.C. 154(b) by 0 days.

(21) Appl. No.: 12/325,513

(22) Filed: Dec. 1, 2008

(65) Prior Publication Data

US 2009/0140786 A1 Jun. 4, 2009

(30) Foreign Application Priority Data

Dec. 3, 2007 (JP) .............................. 2007-312386

(51) Int. Cl.
*H03K 3/017* (2006.01)

(52) U.S. Cl. ...................................... 327/176; 327/172

(58) Field of Classification Search ................. 327/172, 327/176, 178, 291, 293, 294, 299
See application file for complete search history.

(56) References Cited

U.S. PATENT DOCUMENTS

| | | | |
|---|---|---|---|
| 7,312,657 B2 | 12/2007 | Kurokawa | |
| 7,372,312 B2 * | 5/2008 | He et al. ..................... | 327/172 |
| 7,378,889 B2 * | 5/2008 | Wu ............................. | 327/176 |
| 7,456,668 B2 * | 11/2008 | Nakanishi et al. ........... | 327/176 |
| 7,629,823 B2 * | 12/2009 | Wang ......................... | 327/172 |

| | | |
|---|---|---|
| 2008/0174351 A1 | 7/2008 | Nakanishi et al. |

FOREIGN PATENT DOCUMENTS

| | | |
|---|---|---|
| JP | 05-48406 | 2/1993 |
| JP | 05-275995 | 10/1993 |
| JP | 09-214302 | 8/1997 |
| JP | 2004-320097 | 11/2004 |
| JP | 2005-303814 | 10/2005 |
| JP | 2007-089122 | 4/2007 |
| JP | 2007-329698 | 12/2007 |
| JP | 2007-336361 | 12/2007 |
| JP | 2008-206128 | 9/2008 |

\* cited by examiner

*Primary Examiner*—Hai L Nguyen
(74) *Attorney, Agent, or Firm*—Renner, Otto, Boisselle & Sklar, LLP

(57) ABSTRACT

A pulse width modulation circuit includes a first electric-charge accumulator; a second electric-charge accumulator; a first current generator which generates a first current corresponding to the amplitude of an input AC voltage; a second current generator which generates a second current with a constant value; a first current supply controller which supplies the first current to the first electric-charge accumulator; a second current supply controller which supplies the second current to the first electric-charge accumulator; a third current supply controller which supplies the first current to the second electric-charge accumulator; a fourth current supply controller which supplies the second current to the second electric-charge accumulator; and a current limiter which limits the first current to a third current with a predetermined current value, if the amplitude of the AC voltage in the negative side exceeds a predetermined level.

11 Claims, 13 Drawing Sheets

[Fig. 1]
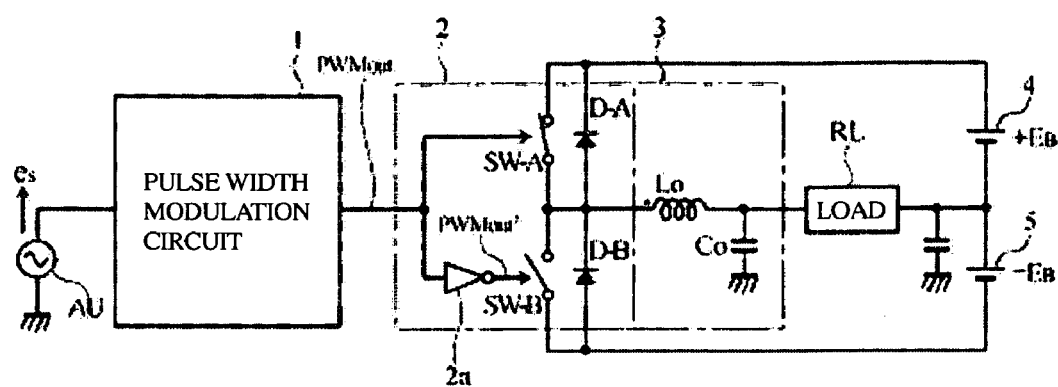

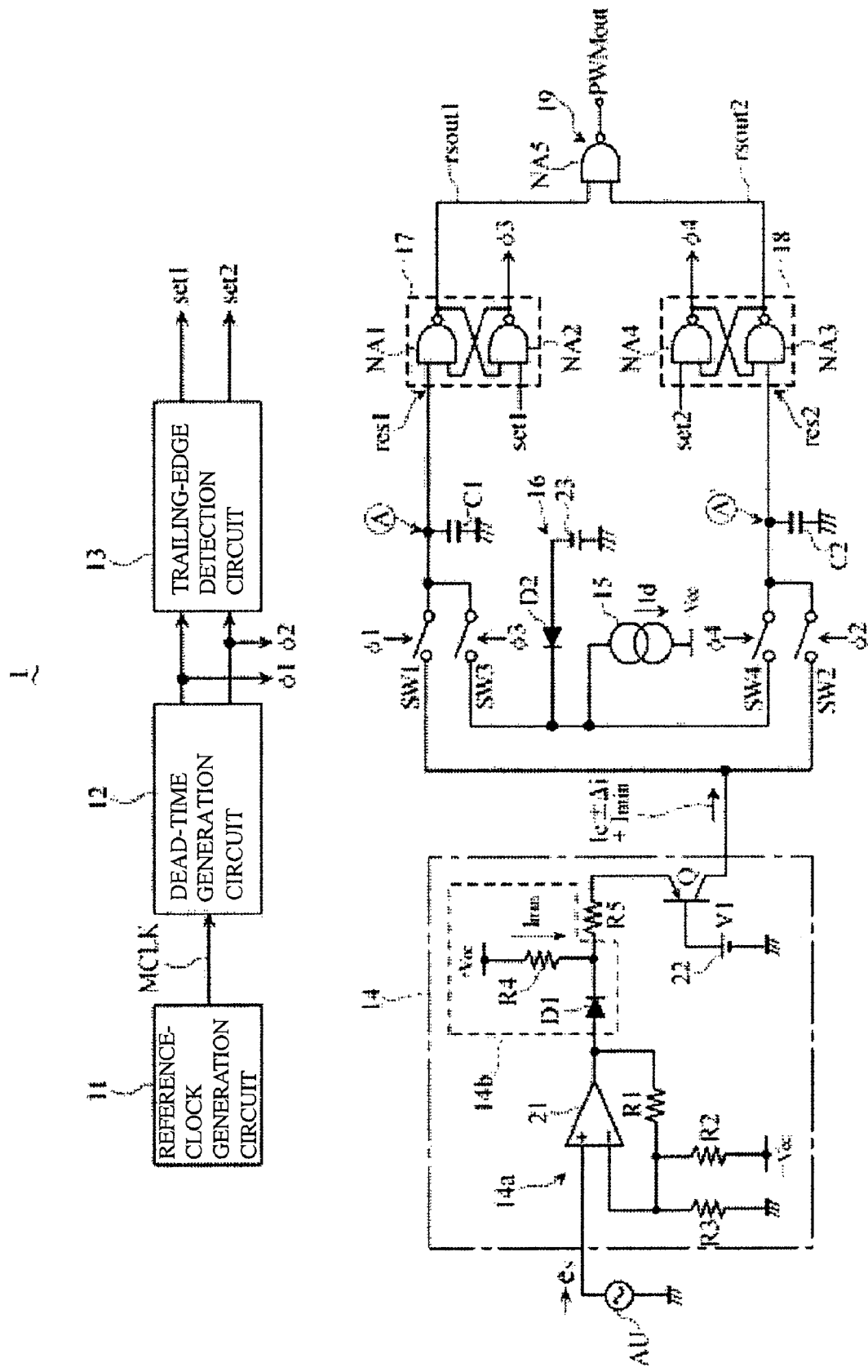
[Fig. 2]

[Fig. 3A]
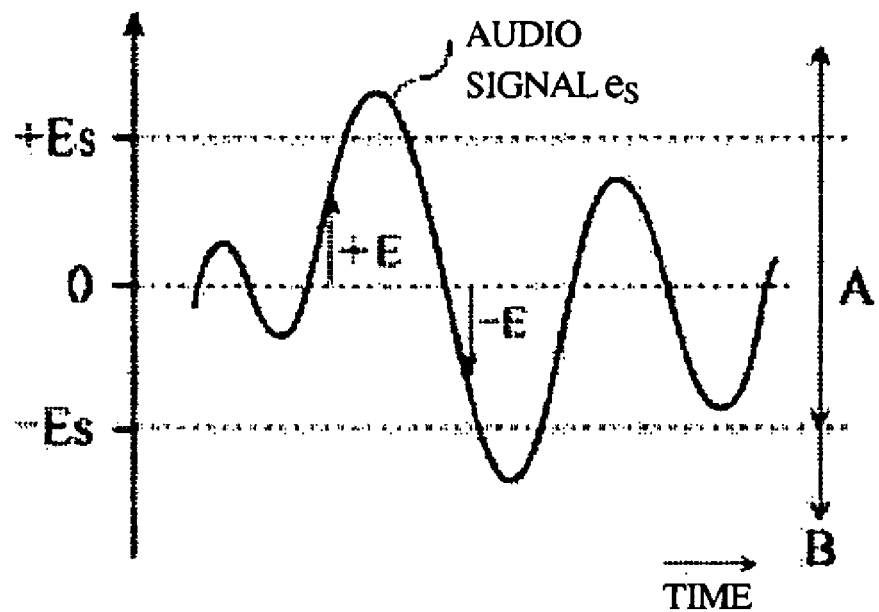
[Fig. 3B]
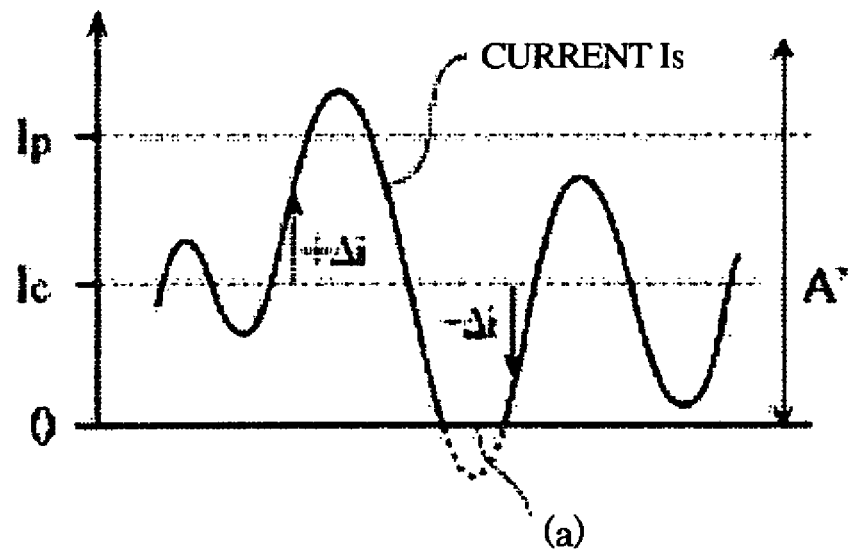

[Fig. 4]
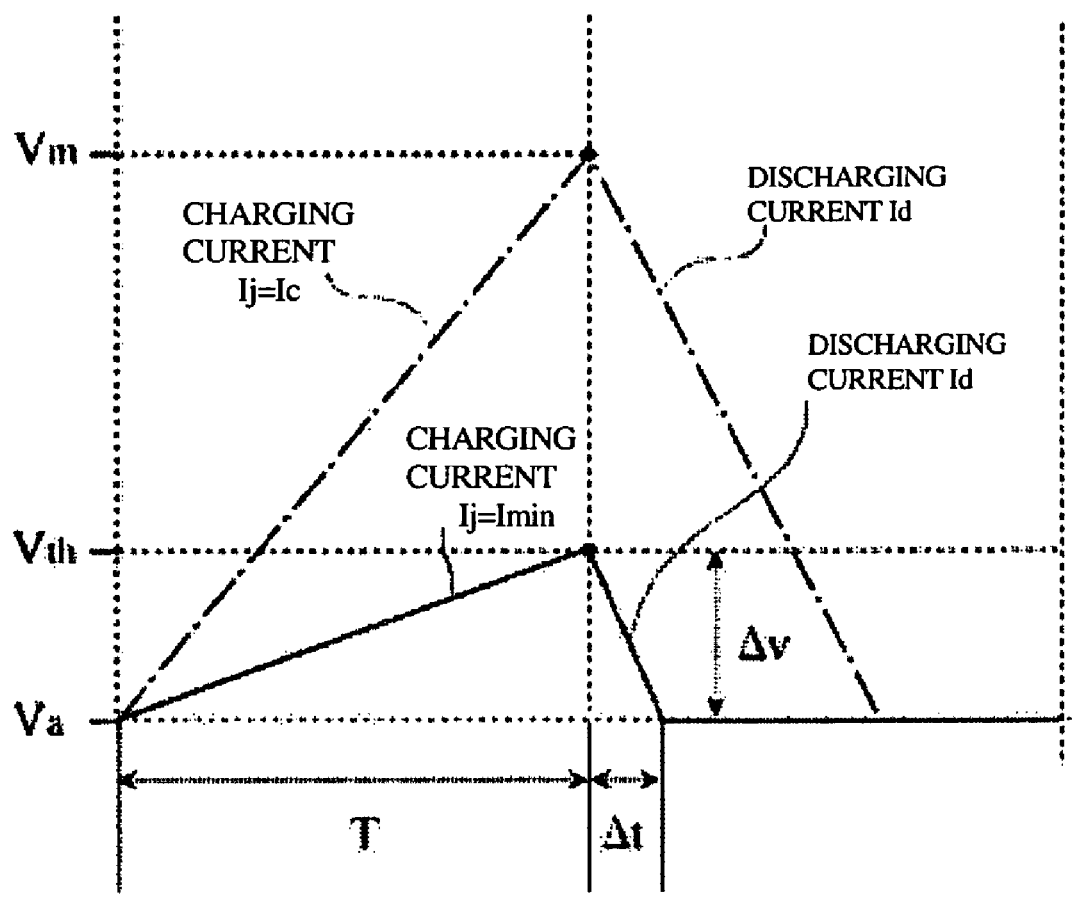

[Fig. 5]
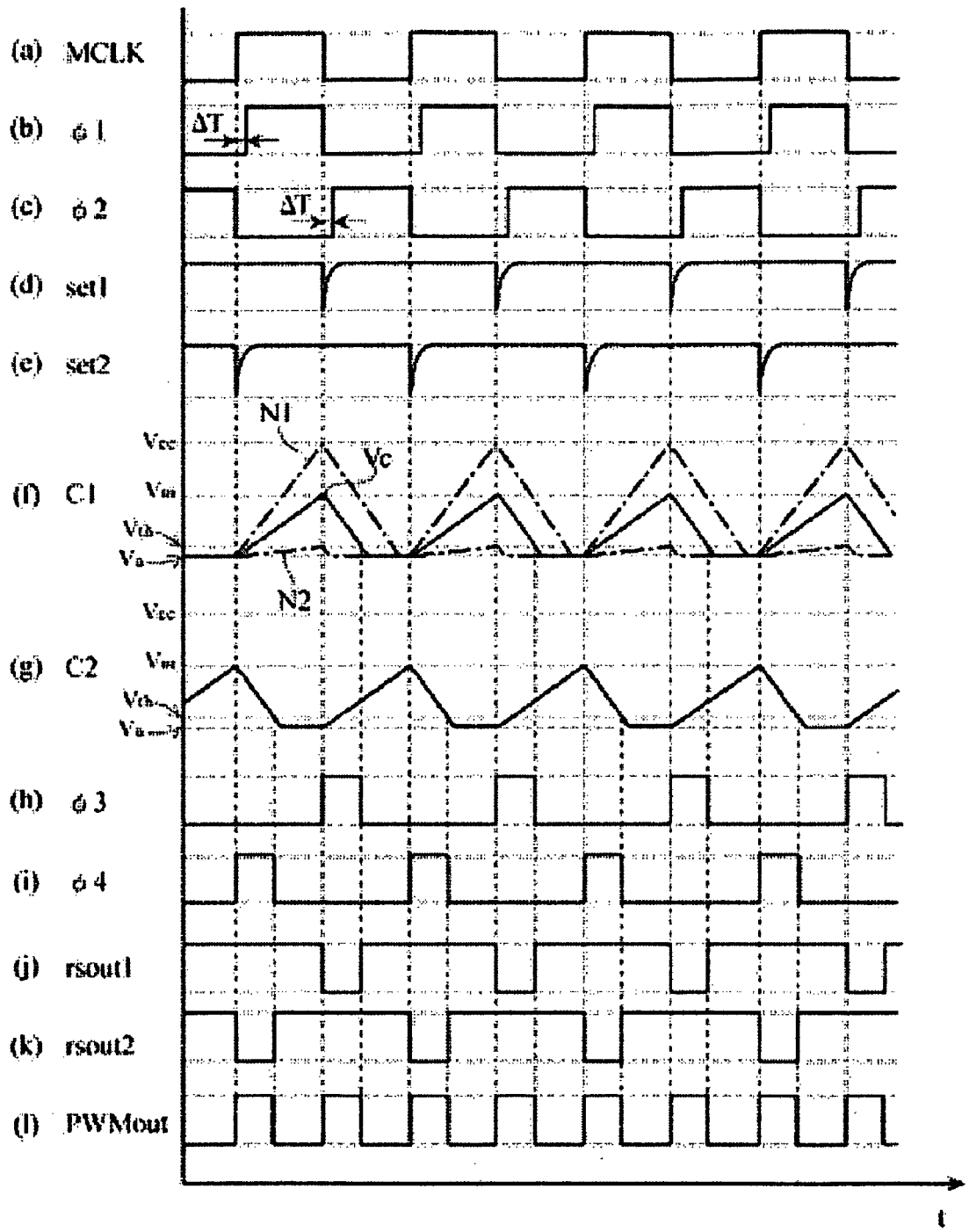

[Fig. 6]
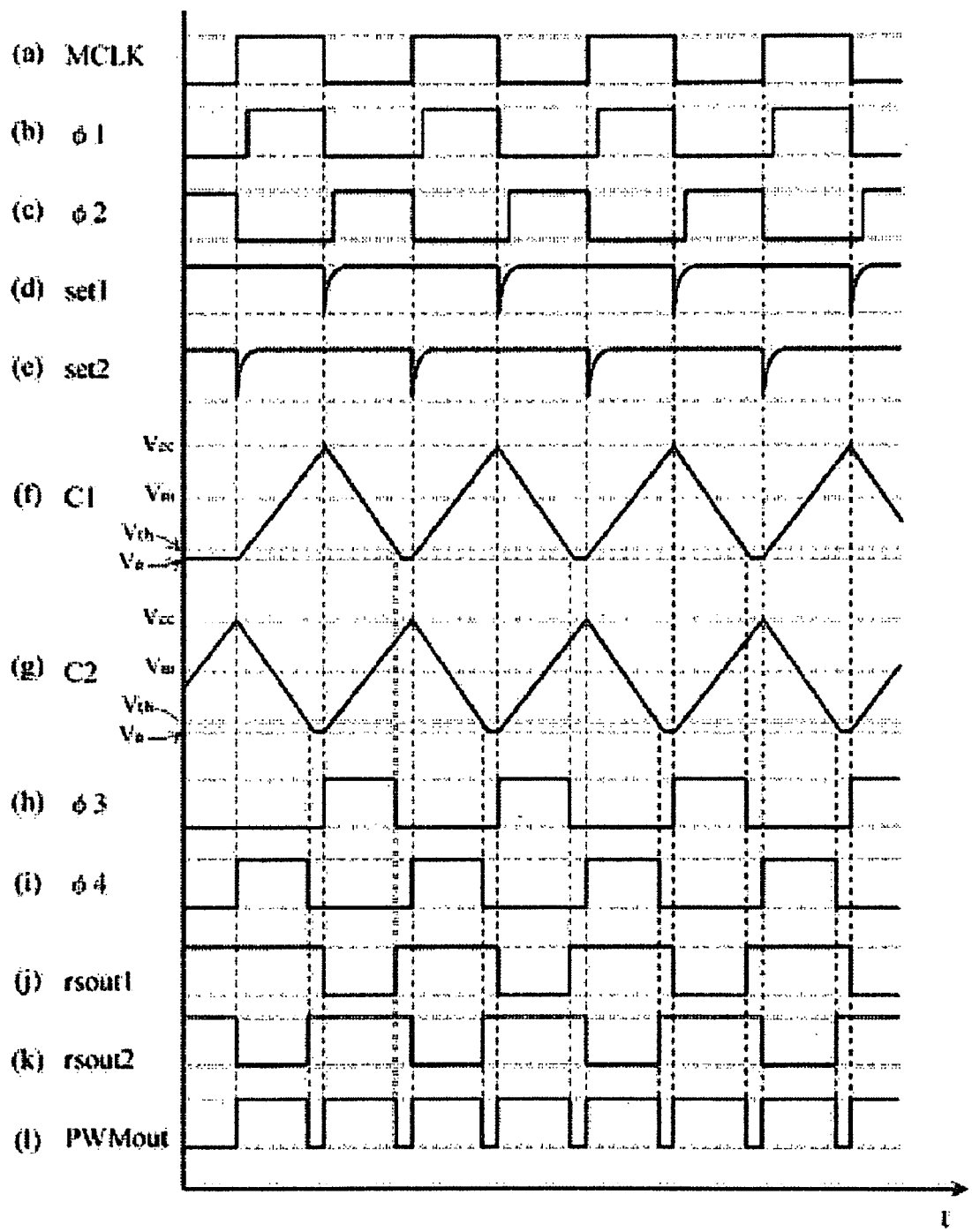

[Fig. 7]
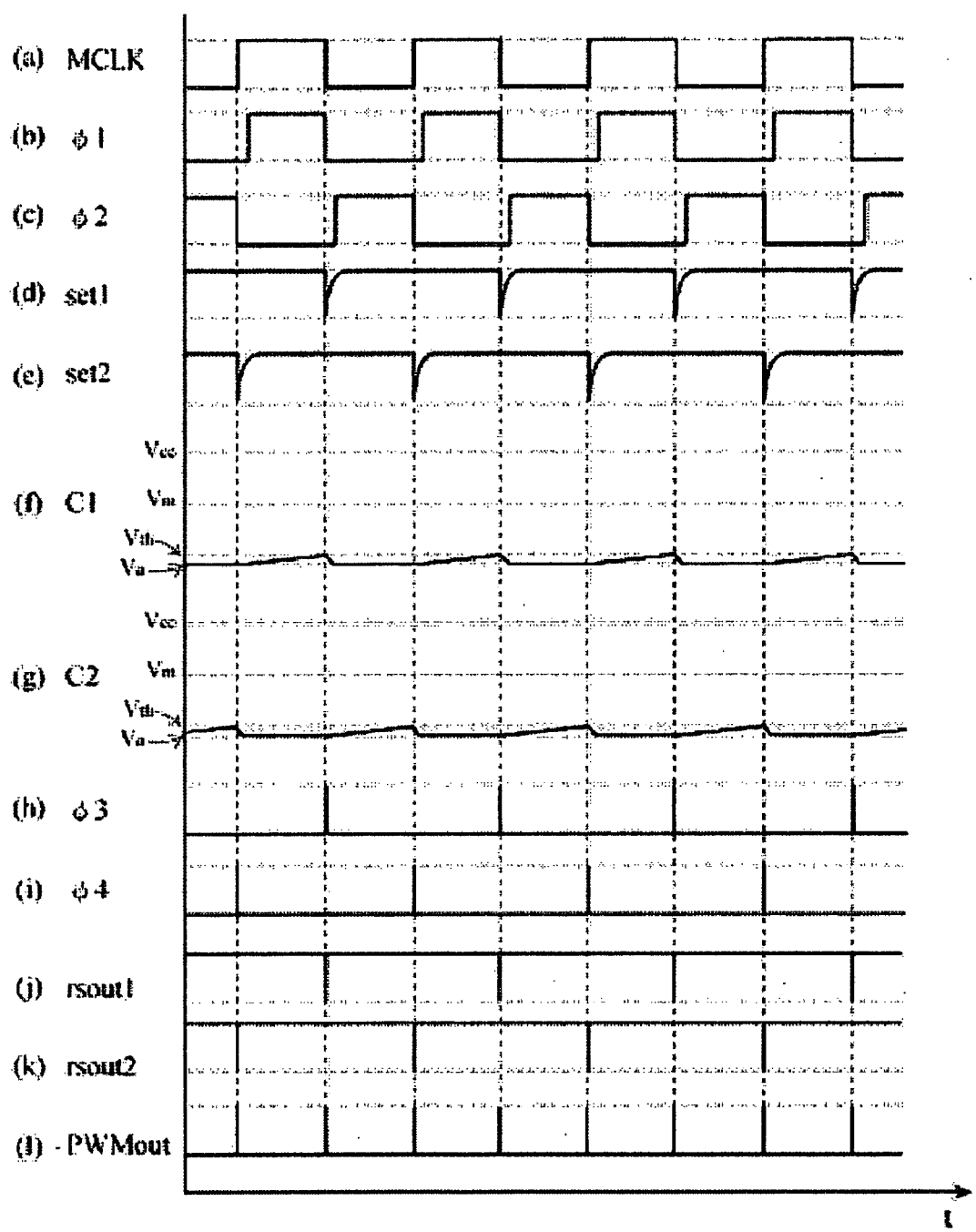

[Fig. 8]
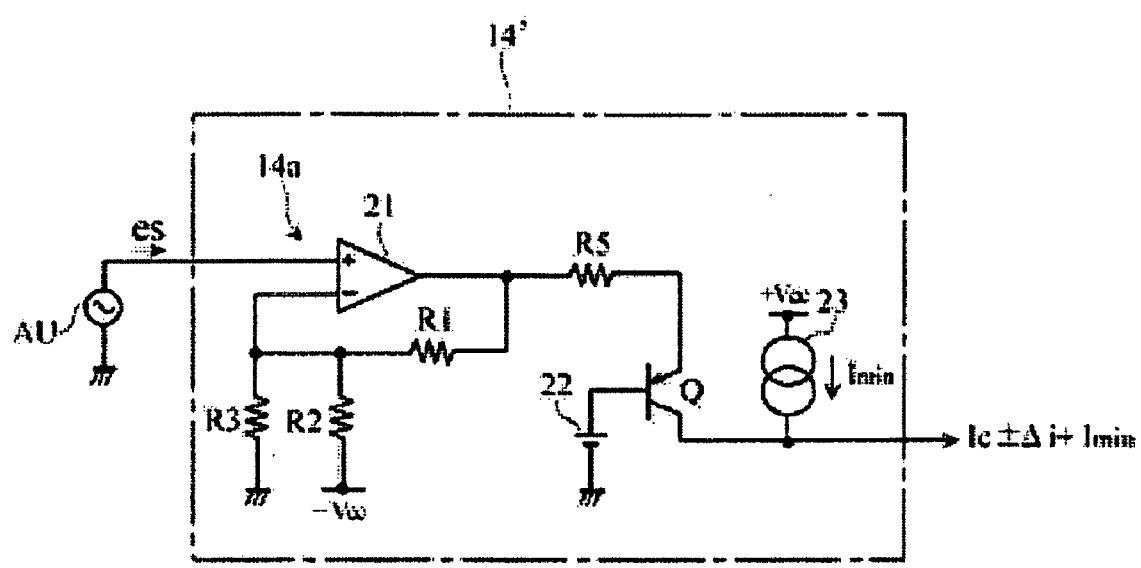

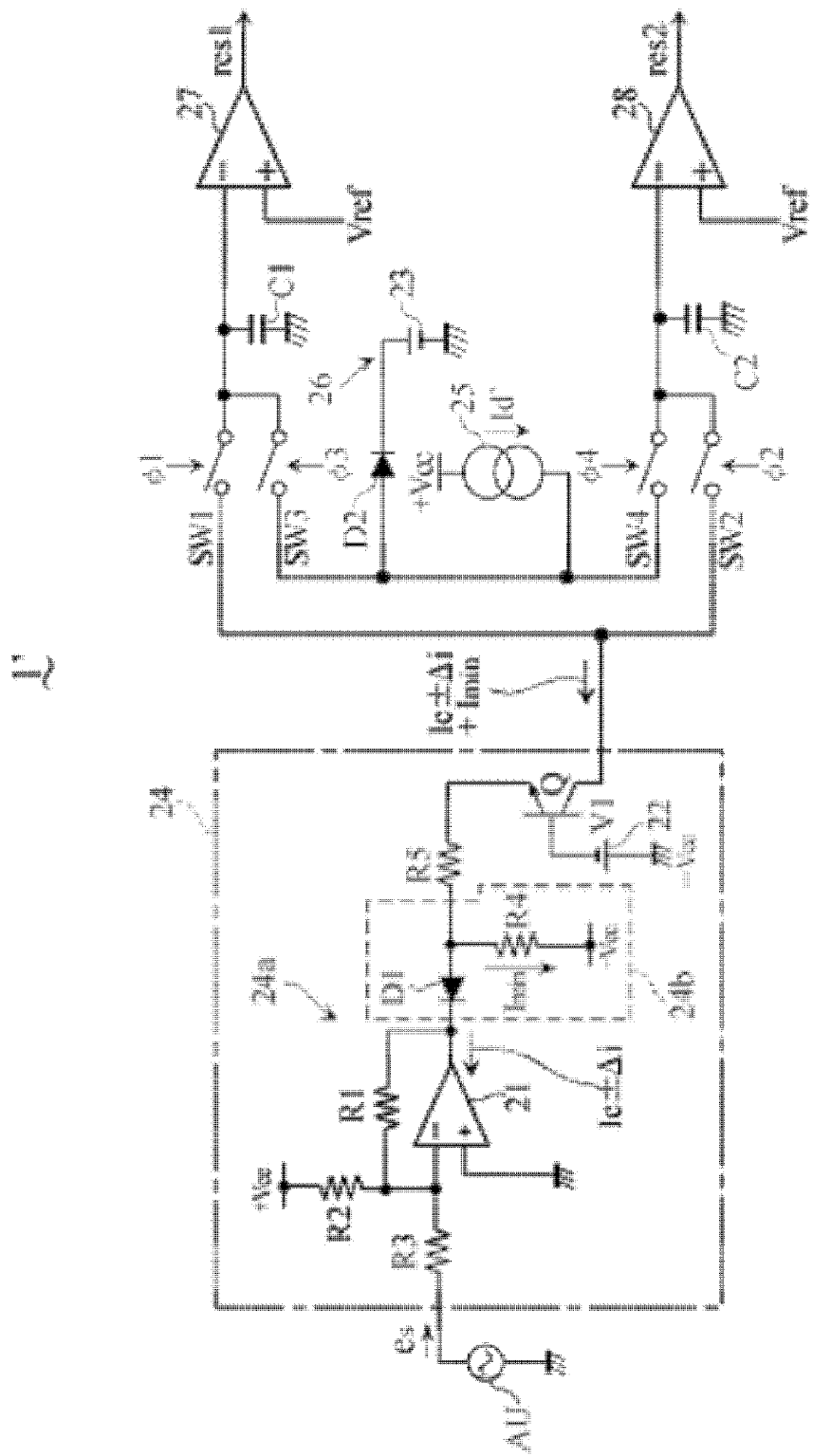
[Fig. 9]

[Fig. 10]
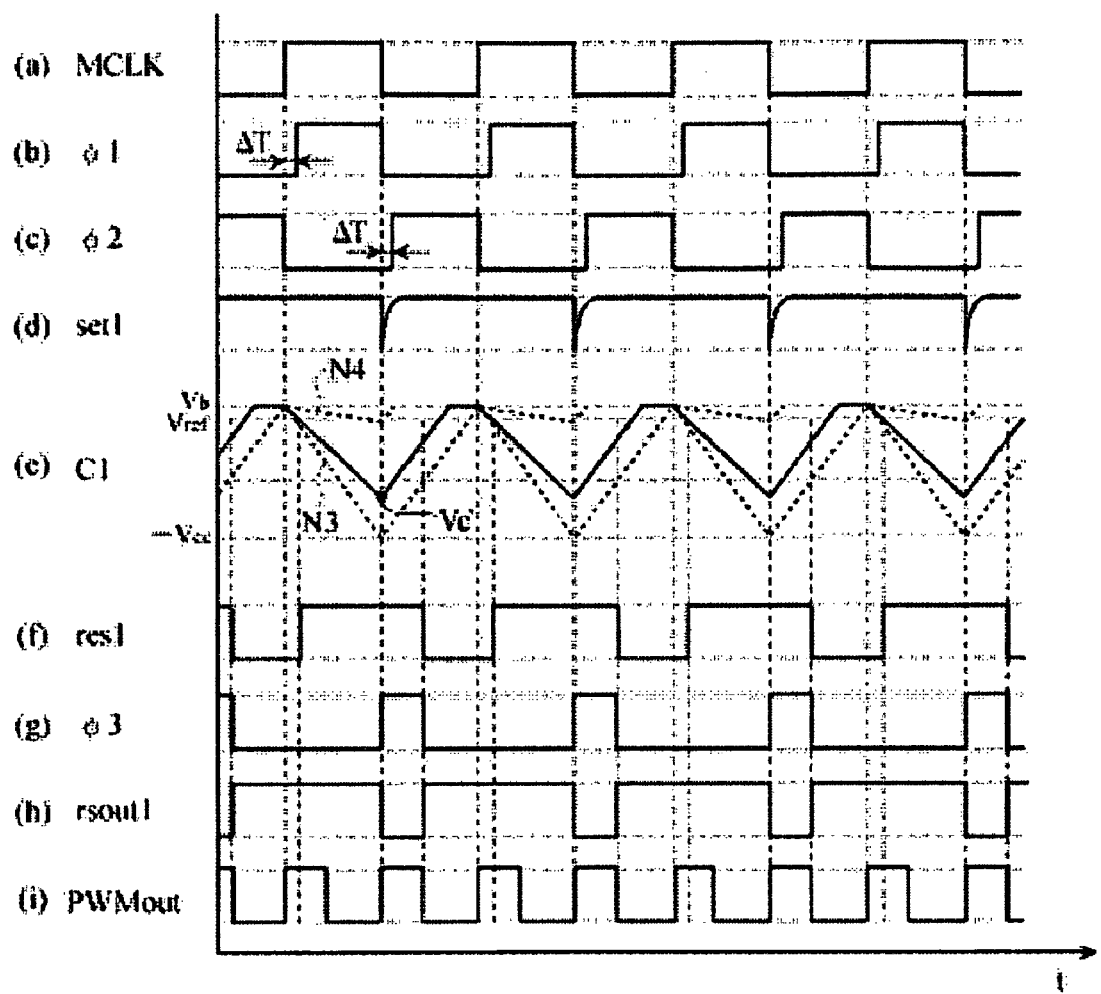

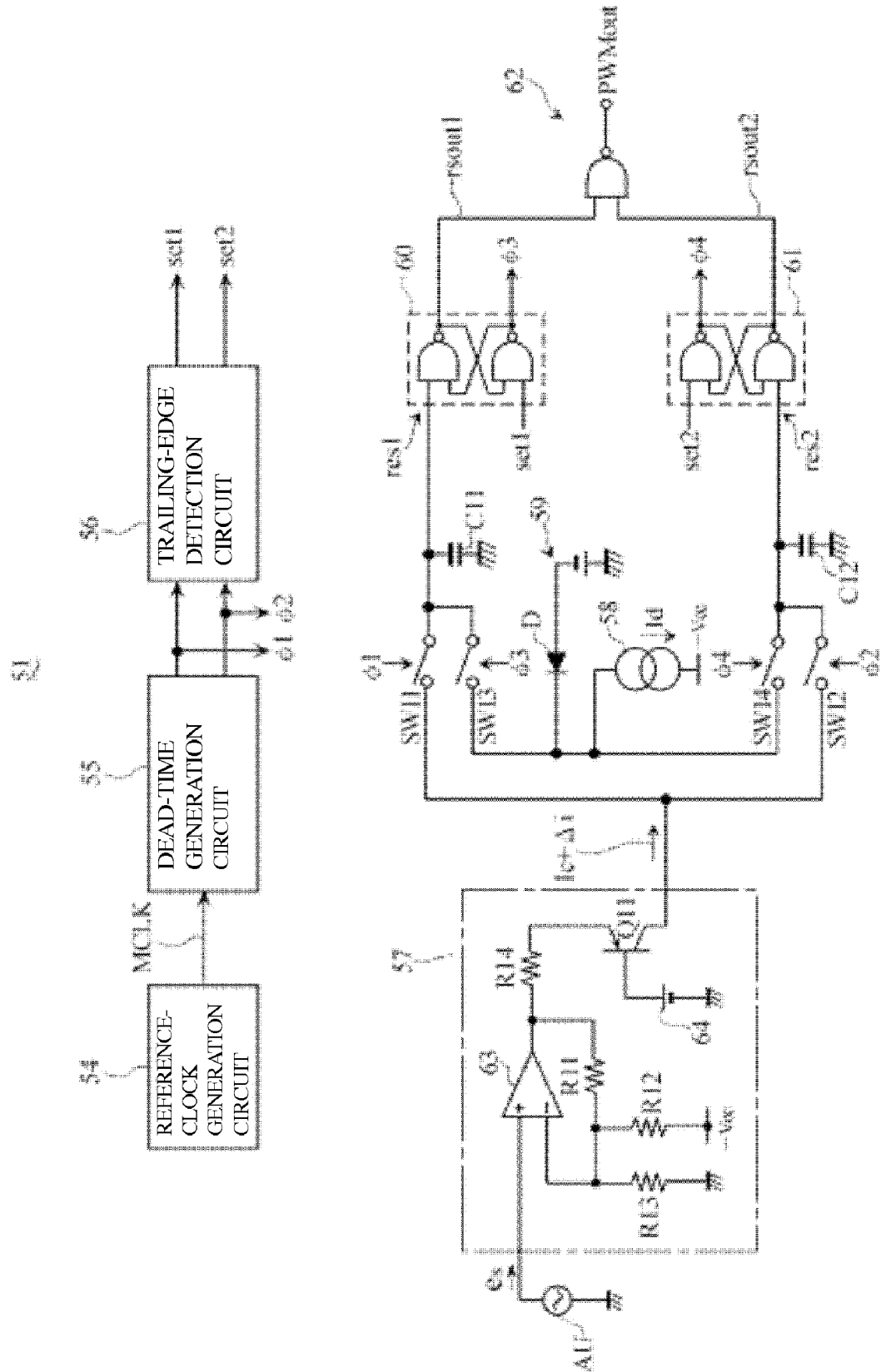
[Fig. 11]

[Fig. 12]
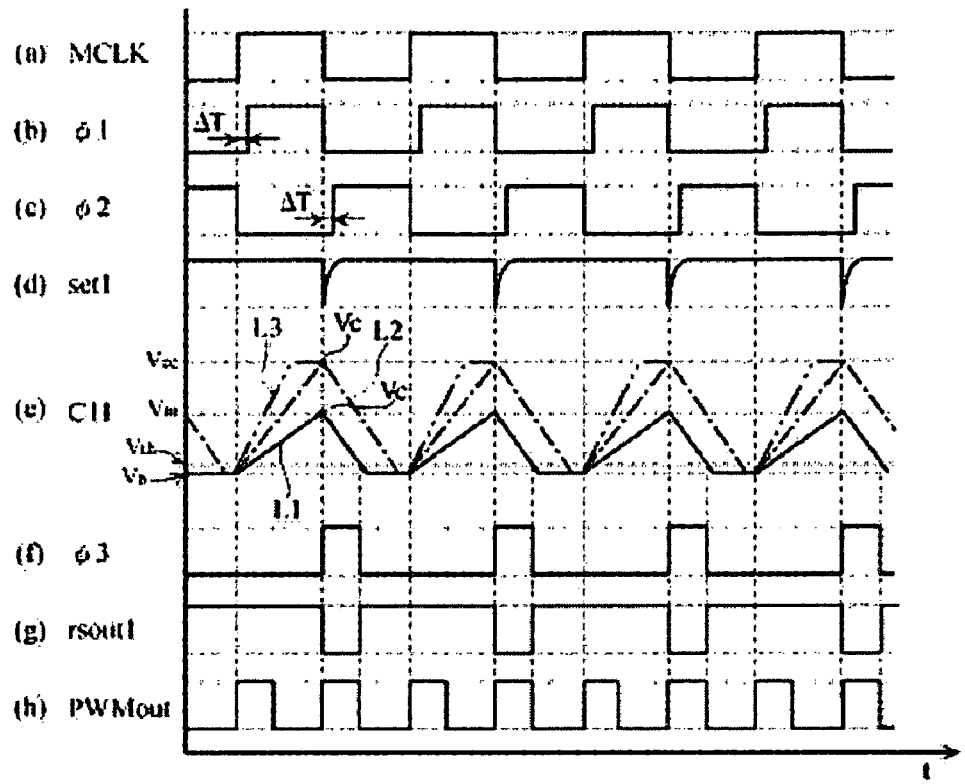
[Fig. 13]
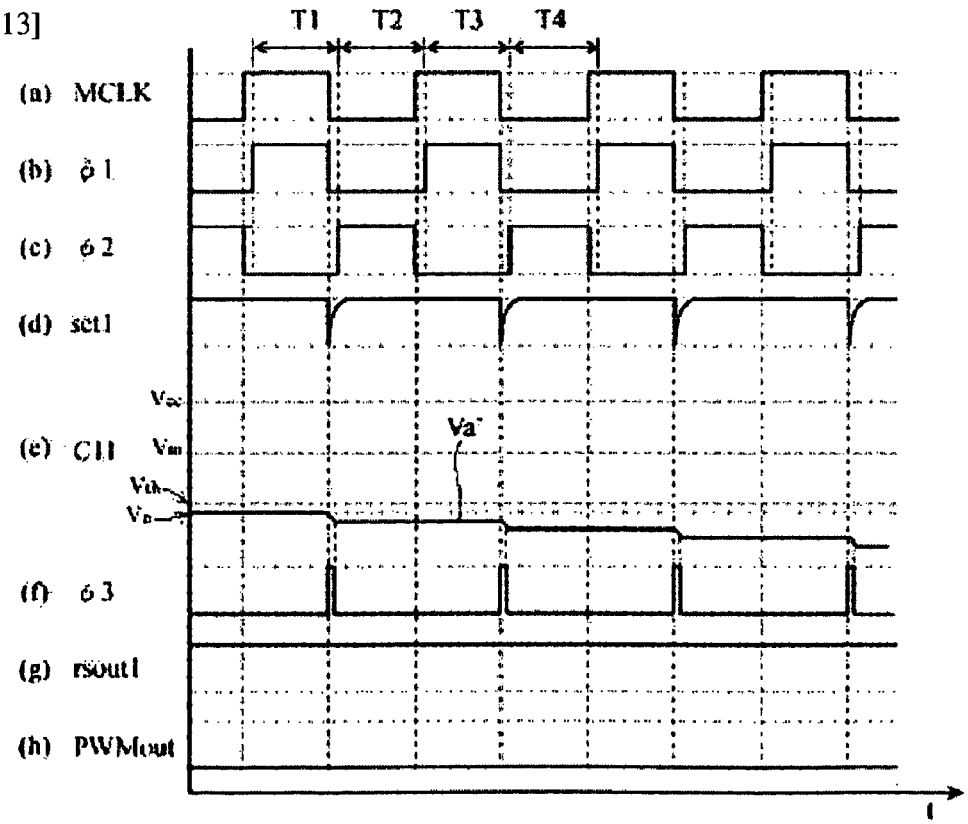

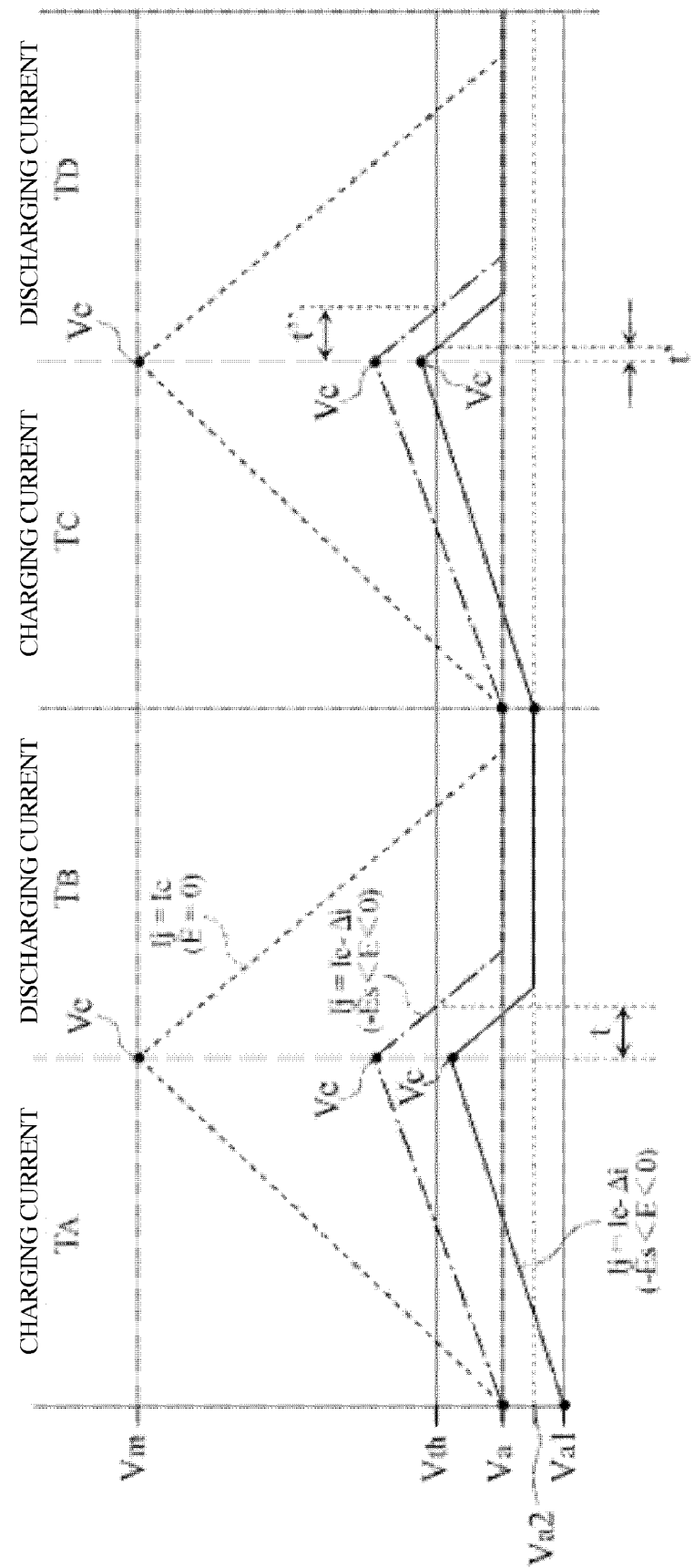
[Fig. 14]

PULSE WIDTH MODULATION CIRCUIT AND SWITCHING AMPLIFIER USING THE SAME

BACKGROUND OF THE INVENTION

1. Field of the Invention

The present invention relates to a pulse width modulation circuit which converts, for example, an audio signal into a pulse-width modulated signal having a constant period and having a duty ratio varying with the amplitude of the audio signal and then outputs the pulse-width modulated signal and, also, relates to a switching amplifier (for example, an audio amplifier) using the same.

2. Description of the Related Art

Conventionally, there have been suggested pulse width modulation circuits for converting an AC voltage signal such as an audio signal into a pulse-width modulated signal with a duty ratio varying with the amplitude of the AC voltage signal. For example, in JP-A No. 2007-89122, there is suggested a pulse width modulation circuit which employs a monostable multivibrator. Further, the present applicant has suggested a pulse width modulation circuit of a type employing no monostable multivibrator (refer to, for example, Japanese Patent No. 4,100,455).

FIG. 11 is a circuit diagram illustrating the schematic structure of the pulse width modulation circuit which has been suggested by the present applicant. Further, FIG. 12 and FIG. 13 are timing charts illustrating the voltage waveforms of respective signals in the pulse width modulation circuit illustrated in FIG. 11. Further, FIG. 12 and FIG. 13 mainly illustrate waveforms during operations for charging and discharging a first capacitor C11.

The pulse width modulation circuit 51 illustrated in FIG. 11 includes a reference-clock generation circuit 54, a dead-time generation circuit 55, a trailing-edge detection circuit 56, a charging-current generation circuit 57, a discharging constant-current source 58, a current bypass circuit 59, first to fourth switches SW11 to SW14, a first and second capacitors C11 and C12, a first and second RS flip flop circuits 60 and 61, and a signal output circuit 62 constituted by a NAND circuit.

In the pulse width modulation circuit 51 illustrated in FIG. 11, the charging-current generation circuit 57 generates, from an audio signal $e_s$, a current signal Ij (hereinafter, referred to as a "charging current Ij") for charging the first and second capacitors C11 and C12, and the reference-clock generation circuit 54 generates a reference clock MCLK.

The charging current Ij is expressed as Ij=Ic±Δi. The bias voltage at the output terminal of an OP amplifier 63 is determined by −Vcc and resistance devices R11 and R12, and Ic(>0) is determined by this bias voltage, a resistance device R14, a transistor Q11 and a voltage 64. Further, ±Δi is the current resulted from the voltage-to-current conversion performed on the audio signal $e_s$ (the AC voltage signal).

The dead-time generation circuit 55 generates, on the basis of the reference clock MCLK, a first switching signal ϕ1 for controlling the operation for charging the first capacitor C11 and a second switching signal ϕ2 for controlling the operation for charging the second capacitor C12 (see FIGS. 12 (b) and (c)). The first RS flip flop circuit 60 generates a third switching signal ϕ3 for controlling the operation for discharging the first capacitor C11 (see FIG. 12(f)), and the second RS flip flop circuit 61 generates a fourth switching signal ϕ4 for controlling the operation for discharging the second capacitor C12.

The first capacitor C11 is charged by being supplied, through the first switch SW11, with the charging current Ij (=Ic±Δi) from the charging-current generation circuit 57 during the time intervals during which the first switching signal ϕ1 is ON (the time intervals during which it is at a high level). Through this charging, the voltage across the first capacitor C11 is raised from a voltage Va to a voltage Vc corresponding to the amplitude E of the audio signal $e_s$ (hereinafter, referred to as a "charging end voltage Vc") during each time interval during which the first switching signal ϕ1 is ON (see FIGS. 12(b) and (e)). Further, FIG. 12(e) illustrates a voltage waveform L1 which has a charging end voltage Vc of Vm and, further, illustrates voltage waveforms L2 and L3 which have a charging end voltage Vc of Vcc.

During each OFF time interval (each low-level time interval) of the first switching signal ϕ1, if a first set signal set1 (a signal which momentarily descends to a low level) resulted from the detection of the trailing edge of the first switching signal ϕ1 (the inversion to the low level) by the trailing-edge detection circuit 56 is inputted to the set terminal of the first RS flip flop circuit 60, this causes the third switching signal ϕ3 outputted from the one of the terminals of the first RS flip flop circuit 60 to be inverted to a high level, which causes the third switch SW13 to supply a constant current Id (hereinafter, referred to as a "discharging current Id") from the constant-current source 58 to the first capacitor C11, thereby starting discharging the first capacitor C11 (see FIG. 12(d), (e) and (f)).

When the voltage across the first capacitor C11 has decreased from the charging end voltage Vc to a predetermined threshold voltage Vth (a threshold voltage for distinguishing between the high level and the low level of the first RS flip flop circuit 60) after the start of the discharging, this voltage is inputted as a first reset signal res1 to the first RS flip flop circuit 60, which inverts the third switching signal ϕ3 to the low level, thereby causing the third switch SW3 to electrically separate the constant-current source 58. Even when the third switching signal ϕ3 has been inverted to the low level, there is a short time lag until the OFF operation is actually performed on the third switch SW13, thereby decreasing the voltage across the first capacitor C11 to a voltage Va which is slightly lower than the threshold voltage Vth during this time lag. This voltage Va is maintained until the end of the OFF time interval of the first switching signal ϕ1 (the discharging time interval) (see FIGS. 12(e) and (f)) and becomes the charging start voltage in the next charging time interval.

Accordingly, the voltage Va becomes the voltage at the start of charging (hereinafter, referred to as "the charging start voltage Va") in each ON time interval (charging time interval) of the first switching signal ϕ1 and becomes a reference voltage for raising the voltage across the first capacitor C11 to the charging end voltage Vc corresponding to the amplitude E of the audio signal $e_s$.

The output rsout1 which is outputted from the other output terminal of the first RS flip flop circuit 60 is inverted to the low level if a first set signal set1 is inputted thereto and, thereafter, is inverted to the high level if a first reset signal res1 is inputted thereto. Namely, during each discharging time interval, the first RS flip flop circuit 60 outputs, from the other output terminal, an output rsout1 constituted by a pulse signal with a pulse width equal to the discharging time interval for the first capacitor C11 (the time interval required for decreasing the voltage thereacross from the charging end voltage Vc to the threshold voltage Vth) (see FIG. 12(g)).

The same charging and discharging control as that for the first capacitor C11 is performed for the second capacitor C12 and, during each discharging time interval, the second RS flip flop circuit 61 outputs, from the other output terminal, an output rsout2 constituted by a pulse signal with a pulse width equal to the discharging time interval for the second capacitor C12 (the time interval required for decreasing the voltage thereacross from the charging end voltage Vc to the threshold voltage Vth).

The operations for charging and discharging the second capacitor C12 are controlled on the basis of the second switching signal φ2 and, accordingly, the charging and discharging time intervals therefor are deviated from the charging and discharging time intervals for the first capacitor C11 by half the period of the reference clock MCLK. Accordingly, the pulse signal of the output rsout1 and the pulse signal of the output rsout2 are alternately generated in each half cycle of the reference clock MCLK.

Further, the signal output circuit 62 outputs a pulse-width modulated signal PWMout generated by synthesizing the output rsout1 and the output rsout2 (see 12(h)).

Further, the solid line L1 illustrated in FIG. 12(e) indicates a waveform during charging and discharging of the first capacitor C11, indicating a waveform in the case where the audio signal $e_s$ is a non signal ($\Delta i=0$). In the case where the audio signal $e_s$ is a non signal ($\Delta i=0$), the first capacitor C11 is charged with a DC bias current Ic, and this DC bias current Ic is set such that the charging end voltage Vc is a voltage Vm intermediate between the power supply voltage Vcc and the threshold voltage Vth of the first RS flip flop circuit 60 (which is nearly equal to (Vcc–Vth)/2, hereinafter, referred to as a "intermediate voltage Vm").

When the amplitude E of the audio signal $e_s$ is positive (Ij=Ic+$\Delta$i), the slope of the charging waveform becomes more abrupt than that of the solid line L1 according to the value of the amplitude E and, if the amplitude E of the audio signal $e_s$ exceeds a predetermined level (this level is assumed to be "+Es"), as illustrated by a chain line L2 and a two-dot chain line L3, the charging end voltage Vc is continuously clipped to substantially the power supply voltage +Vcc for the first RS first flip circuit 60 (more accurately, the power supply voltage +Vcc plus the forward voltage of the protective diode incorporated in the input terminal of the NAND circuit) and, therefore, is fixed. Accordingly, when the amplitude E of the audio signal $e_s$ at its positive side is excessively larger, the pulse width of the pulse-width modulated signal PWMout is fixed, regardless of the value of the amplitude E.

On the other hand, when the amplitude E of the audio signal $e_s$ is negative (Ij=Ic–$\Delta$i), the slope of the charging waveform becomes more moderate than that of the solid line L1 according to the value of the amplitude E and, if the amplitude E of the audio signal $e_s$ exceeds a predetermined level (this level is assumed to be "–Es"), the charging current Ij is clipped to "0" and, therefore, the charging and discharging waveforms are as illustrated in FIG. 13(e).

In this case, the voltages across the first capacitor C11 and the second capacitor C12 are not raised to equal to or higher than the threshold voltage Vth during the respective charging time intervals. This makes it impossible to generate, during the respective discharging time intervals, an output rsout1 and an output rsout2 having pulse signals with pulse widths corresponding to the discharging time intervals. This prevents the pulse-width modulated signal PWMout from being pulse signals, thereby causing the pulse-width modulated signal PWMout to be fixed to a low level as illustrated in FIG. 13(h).

The method for generating a pulse-width modulated signal PWMout with the pulse width modulation circuit 51 illustrated in FIG. 11 is based on that the discharging time intervals for the first and second capacitors C11 and C12 in the respective discharging time intervals are made corresponding to the amplitude E of the audio signal $e_s$, and the discharging time intervals are determined by the charging end voltage Vc with respect to the charging start voltage Va across the first and second capacitors C11 and C12. Therefore, it is important that the charging start voltage Va in each charging time interval is stabilized, no matter how the amplitude E of the audio signal $e_s$ varies, even in cases where the amplitude E is clipped.

However, if the amplitude E of the audio signal $e_s$ becomes negatively excessive to such an extent that it falls within the range of E<–Es, the charging current Ij is decreased to about 0 and, if this state is continued, as illustrated in FIG. 13(e), the first capacitor C11 and the second capacitor C12 are not charged to such an extent that the voltages across them are raised from the charging start voltage Va to equal to or higher than the threshold voltage Vth during the respective charging time intervals. Accordingly, during the discharging time interval subsequent to each discharging time interval, discharging time is not generated, which causes the level of the pulse-width modulated signal PWMout to be continuously maintained at a low level (see the waveform of FIG. 13(h)).

At the state where the level of the pulse-width modulated signal PWMout is fixed to the low level, the sounds generated by replaying the pulse-width modulated signal PWMout are distorted. The waveform of the pulse-width modulated signal PWMout itself reflects the audio signal $e_s$ having the amplitude E clipped to –Es. Accordingly, this phenomenon is not a problem specific to the aforementioned method for generating a pulse-width modulated signal PWMout. However, the phenomenon that the voltages across the first and second capacitors C11 and C12 are not raised to equal to or higher than the threshold voltage Vth during the respective charging time intervals degrades the stability of the charging start voltage Va, which is an important problem for the aforementioned method for generating a pulse-width modulated signal PWMout.

More specifically, during a time interval T1 in FIG. 13, at a state where the audio signal $e_s$ is negatively excessive (a state of $e_s$<–Es), if the charging current Ij is substantially 0, the first capacitor C11 is not charged, and the voltage thereacross is maintained at the charging start voltage Va until the end of the charging. Further, at the timing when the first switching signal φ1 descends, a first set signal set1 momentarily turns on the third switching signal φ3, which causes the third switch SW3 to be kept at the ON state during this ON time interval, thereby discharging the electric charge accumulated in the first capacitor C11 and decreasing the voltage across the first capacitor C11 to slightly below the charging start voltage Va.

During the time interval T2 and the time interval T3 subsequent to the time interval T1, no discharging operation and no charging operation are performed substantially, which causes the voltage across the first capacitor C11 to be maintained at a voltage Va' which is slightly lower than the charging start voltage Va, and this voltage Va' becomes the charging start voltage in the time interval T4 subsequent to the time interval T3. Further, during the time interval T4, the same operations as those in the time interval T1 are performed again, which causes the voltage across the first capacitor C11 to be decreased to a voltage slightly lower than the voltage Va'. Thereafter, the same phenomenon is repeated, which causes stepwise decreases in the charging start voltage across the first capacitor C11, from the initial charging start voltage Va. The aforementioned phenomenon occurs similarly for the second capacitor C12, and the charging start voltage across the second capacitor C12 is decreased in a stepwise manner from the initial charging start voltage Va.

The charging start voltage Va across the first and second capacitors C11 and C12 is decreased in a stepwise manner during each single cycle of the first switching signal φ1 and the second switching signal φ2. Accordingly, if a state where the amplitude E of the audio signal $e_s$ is negatively excessive is continued over several cycles to several tens of cycles, this will induce greater amounts of decreases in the voltages across the first and second capacitors C11 and C12 from the charging start voltage Va. Even if the amplitude E of the audio signal $e_s$ is restored to the normal state (the state of −Es<E<0) from the state where it is negatively excessive (a state of E<−Es), the voltages across the first capacitor C11 and the second capacitor C12 may not be raised to equal to or higher than the threshold voltage Vth from the charging start voltage (<Va) during the charging time intervals, depending on the charging current Ij (=Ic−Δi) at this time.

For example, as illustrated in FIG. 14, when the charging start voltage across the first capacitor C11 has decreased to Va1 (<Va) at the time the amplitude E of the audio signal $e_s$ is restored to the normal state (the state of −Es<E<0) from a state where it is negatively excessive (E<−Es), if the first capacitor C11 were charged with the charging current Ij from the charging start voltage Va during a charging time interval Ta, the charging end voltage Vc would become higher than the threshold voltage Vth, as illustrated by the waveform of a chain line, but, as illustrated by a solid line, the charging is started from the voltage Va1 and the charging end voltage Vc does not reach the threshold voltage Vth and, in this case, no discharging time t can be provided during the discharging time interval TB, thereby maintaining the pulse-width modulated signal PWMout at the low level.

Further, the charging start voltage Va across the first capacitor C11 is changed from Va1 to Va2 (Va1<Va2<Vth) during the discharging time interval TB and, then, the first capacitor C11 is charged with the charging current Ij from the voltage Va2 during the next charging time interval TC and, even if the charging end voltage Vc exceeds the threshold voltage Vth, the discharging time interval t' detected during the discharging time interval TD is shorter than the normal discharging time interval t". Accordingly, the pulse of the pulse-width modulated signal PWMout generated on the basis of this discharging time interval t' does not correspond to the amplitude E of the audio signal $e_s$.

Namely, due to the stepwise decreases of the charging start voltage Va, the responsivity of the pulse-width modulated signal PWMout is delayed by at least the time intervals TA to TD (corresponding to two cycles of the reference clock MCLK), at the time the amplitude E of the audio signal $e_s$ is restored to the normal state (the state of −Es<E<0) from the state where it is negatively excessive (the state of E<−Es). This induces the inconvenience that the state where the reproduced sounds are distorted is continued over the lag time interval.

The present invention was made in view of the aforementioned circumstances and aims at providing a pulse width modulation circuit capable of, even if an input AC signal becomes negatively excessive, outputting normal pulse-width modulated signals immediately without inducing a time lag, when the input AC signal is restored from the state where it is excessive to a normal state and also at providing a switching amplifier which incorporates the pulse width modulation circuit.

SUMMARY OF THE INVENTION

A pulse width modulation circuit provided according to a first aspect of the present invention includes a reference-clock generator which generates a reference clock; a first electric-charge accumulator which accumulates an electric charge; a second electric-charge accumulator which accumulates an electric charge; a first current generator which generates, from an input AC voltage, a first current with a current value varying with the amplitude of this AC voltage; a second current generator which generates a second current with a constant current value; a first current supply controller which, during high-level half cycles of the aforementioned reference clock, supplies the aforementioned first current to the aforementioned first electric-charge accumulator during the high-level time intervals, in order to change the voltage across the aforementioned first electric-charge accumulator from a first voltage to a second voltage corresponding to the amplitude of the aforementioned AC voltage; a second current supply controller which, during low-level half cycles subsequent to the half cycles during which the aforementioned first current is supplied, supplies the aforementioned second current to the aforementioned first electric-charge accumulator, in the opposite direction from that of the aforementioned first current, until a predetermined time is elapsed after the voltage across the first electric-charge accumulator is changed from the aforementioned second voltage to a predetermined threshold value between the second voltage and the aforementioned first voltage; a first pulse-signal generator which, during the low-level half cycles subsequent to the half cycles during which the aforementioned first current is supplied, generates pulse signals with a pulses width corresponding to the time interval required for changing the voltage across the aforementioned first electric-charge accumulator from the aforementioned second voltage to the aforementioned threshold voltage; a third current supply controller which, during the low-level half cycles of the aforementioned reference clock, supplies the aforementioned first current to the aforementioned second electric-charge accumulator during the low-level time intervals, in order to change the voltage across the aforementioned second electric-charge accumulator from the aforementioned first voltage to the aforementioned second voltage; a fourth current supply controller which, during the high-level half cycles subsequent to the half cycles during which the aforementioned first current is supplied, supplies the aforementioned second current to the aforementioned second electric-charge accumulator, in the opposite direction from that of the aforementioned first current, until the aforementioned predetermined time is elapsed after the voltage across the second electric-charge accumulator is changed from the aforementioned second voltage to the aforementioned threshold value; a second pulse-signal generator which, during the high-level half cycles subsequent to the half cycles during which the aforementioned first current is supplied, generates pulse signals with a pulses width corresponding to the time interval required for changing the voltage across the aforementioned second electric-charge accumulator from the aforementioned second voltage to the aforementioned threshold voltage; and a pulse modulated signal generator which synthesizes the pulse signals generated by the aforementioned first pulse-signal generator and the pulse signals generated by the aforementioned second pulse-signal generator to generate a pulse-width modulated signal; wherein there is provided a current limiter which limits the first current generated by said first current generator to a third current with a predetermined current value, if the amplitude of said AC voltage in the negative side exceeds a predetermined level.

Preferably, said current limiter limits the first current generated by the aforementioned first current generator to a third current with a current value which changes the voltages across the aforementioned first and second electric-charge accumulator at least from the aforementioned first voltage to the aforementioned threshold voltage, if the amplitude of the aforementioned AC voltage in the negative side exceeds a predetermined level.

With this structure, during high-level half cycles of the reference clock, the first current Ij with a current value varying with the amplitude E of the inputted AC voltage (for example, an audio signal) is supplied to the first electric-charge accumulator, during the high-level time intervals. Consequently, the voltage across the first electric-charge accumulator is changed from the first voltage Va to the second voltage Vc corresponding to the amplitude E of the audio signal. For example, when the first current Ij is supplied in the direction that the first electric-charge accumulator is charged, the voltage across the first electric-charge accumulator is raised from the first voltage (hereinafter, referred to as a "charging start voltage") Va to the second voltage (hereinafter, referred to as a "charging end voltage").

After the transition to the low-level half cycles subsequent to the half cycles during which the first electric-charge accumulator is charged with the first current (hereinafter, referred to as a "charging current") Ij, the first electric-charge accumulator is discharged with the second current with a constant current value (hereinafter, referred to as a "discharging current"). This discharging operation is continued until the predetermined time Δt is elapsed after the voltage across the first electric-charge accumulator is decreased from the charging end voltage Vc to the predetermined threshold voltage Vth and, assuming that the voltage at this time is Va', the voltage across the first electric-charge accumulator is held at the voltage Va' until the reference clock is brought into the high level next time.

On the other hand, during low-level half cycles of the reference clock, the charging current Ij is supplied to the second electric-charge accumulator, during the high-level time intervals. Consequently, the voltage across the second electric-charge accumulator is raised from the charging start voltage Va to the charging end voltage Vc corresponding to the amplitude E of the audio signal. After the transition to the high-level half cycles subsequent to the half cycles during which the second electric-charge accumulator is charged with the charging current Ij, the second electric-charge accumulator is discharged with the discharging current Id with a constant current value. This discharging operation is continued until the predetermined time Δt is elapsed after the voltage across the second electric-charge accumulator is decreased from the charging end voltage Vc to the predetermined threshold voltage Vth and, thereafter, the voltage across the second electric-charge accumulator is held at the charging start voltage Va' until the reference clock is brought into the low level next time.

During the low-level time intervals of the reference clock, pulse signals with a pulse width equal to the discharging time required for decreasing the voltage across the first electric-charge accumulator from the charging end voltage Vc to the threshold voltage Vth are generated, while, during the high-level time intervals of the reference clock, pulse signals with a pulse width equal to the discharging time required for decreasing the voltage across the second electric-charge accumulator from the charging end voltage Vc to the threshold voltage Vth are generated. Both the pulse signals are synthesized to generate a pulse-width modulated signal.

With the aforementioned method for generating a pulse-width modulated signal, if the amplitude of the audio signal at its negative side becomes an excessive amplitude exceeding a predetermined level, the charging current Ij generated by the first current generator is limited to a third current with a current value which raises the voltages across the first and second electric-charge accumulator from the charging start voltage Va to the threshold value Vth when the first and second electric-charge accumulator are charged therewith during a time interval equal to a half cycle of the reference clock. Namely, if the amplitude of the audio signal at its negative side exceeds the predetermined level, the current value of the charging current Ij is fixed to the third current and is prevented from decreasing therefrom, regardless of the variation of the amplitude of the audio signal at its negative side.

Accordingly, even if the amplitude of the audio signal at its negative side becomes excessive, the current value of the charging current Ij is prevented from decreasing to equal to or lower than the current value of the third current. Therefore, the voltages across the first and second electric-charge accumulator are certainly raised to a voltage equal to or higher than the threshold voltage Vth in the respective charging time intervals. As a result, during the discharging time interval subsequent to each charging time interval, even if the first or second electric-charge accumulator is discharged during a predetermined time interval Δt after the voltage across the first or second electric-charge accumulator reaches the threshold value Vth, the voltage Va' is prevented from decreasing to equal to or lower than Va. This can stabilize the charging start voltage across the first and second electric-current accumulator at Va in the respective charging time intervals.

Further, when the voltages across the first and second electric-current accumulation mean are changed in the opposite direction from the aforementioned direction by using the first current as a discharging current while using the second current as a charging current, similarly, the discharging start voltage across the first and second electric-charge accumulator can be stabilized at a third voltage in the respective discharging time intervals.

Accordingly, at the time when the audio signal is restored from a state where its amplitude at the negative side is excessive to a normal state, it is possible to generate a pulse-width modulated signal with a pulse width corresponding to the amplitude of the audio signal with preferable responsivity, without inducing a time lag.

Said first and second electric-charge accumulators may be discharged with said first current by said first current supply controller and be charged with said second current by said second current supplier.

Preferably, said first and second electric-charge accumulators are charged with said first current by said first current supply controller and are discharged with said second current by said second current supplier.

Preferably, said first current generator is constituted by a voltage-to-current conversion circuit which employs an operational amplifier, and said current limiter is constituted by a supplemental-current supply circuit which is connected to an output end of said voltage-to-current conversion circuit and adds said third current to the current outputted from the voltage-to-current conversion circuit, and by a switch circuit which electrically separates said voltage-to-current conversion circuit if the amplitude of said AC voltage at its negative side exceeds said predetermined value.

Preferably, said first pulse-signal generator is constituted by a first RS flip flop circuit adapted such that a signal resulted from the detection of the timing when said reference clock is inverted from the high level to the low level is inputted thereto as a first set signal, and a signal resulted from the fact that the voltage across said first electric-charge accumulator has reached said threshold voltage is inputted thereto as a first reset signal, said threshold voltage being set as a threshold voltage for the logic levels, and said second pulse-signal generator is constituted by a second RS flip flop circuit adapted such that a signal resulted from the detection of the timing when said reference clock is inverted from the low level to the high level is inputted thereto as a second set signal, and a signal resulted from the fact that the voltage across said second electric-charge accumulator has reached said threshold voltage is inputted thereto as a second reset signal, said threshold voltage being set as a threshold voltage for the logic levels.

A switching amplifier according to the present invention includes said pulse width modulation circuit according to the present invention, a voltage source which outputs a predetermined reference power supply voltage and a switching circuit which switches said reference power supply voltage supplied from said voltage source, on the basis of modulated signals outputted from said pulse width modulation circuit.

BRIEF DESCRIPTION OF THE DRAWINGS

FIG. 1 is a structure view illustrating a switching amplifier to which a pulse width modulation circuit according to the present invention is applied.

FIG. 2 is a block circuit diagram illustrating a first embodiment of the pulse width modulation circuit according to the present invention.

FIG. 3 is a view illustrating the relationship between an audio signal (AC voltage signal) and an output current in a voltage-to-current conversion portion.

FIG. 4 is a view for describing an equation for determining the magnitude of Imin.

FIG. 5 is a time chart in a case where the amplitude of the audio signal varies within a normal range.

FIG. 6 is a time chart in a case where the amplitude of the audio signal varies within a positively-excessive range.

FIG. 7 is a time chart in a case where the amplitude of the audio signal varies within a negatively-excessive range.

FIG. 8 is a view illustrating an exemplary modification of a charging-current generation circuit.

FIG. 9 is a block circuit diagram illustrating a second embodiment of the pulse width modulation circuit according to the present invention.

FIG. 10 is a view illustrating a time chart for describing the operations of the pulse width modulation circuit according to the second embodiment.

FIG. 11 is a circuit diagram illustrating a pulse width modulation circuit suggested by the present applicant.

FIG. 12 is a timing chart illustrating the voltage waveforms of respective signals in the pulse width modulation circuit illustrated in FIG. 11, illustrating a timing chart in the case where the audio signal is non signal.

FIG. 13 is a timing chart illustrating the voltage waveforms of respective signals in the pulse width modulation circuit illustrated in FIG. 11, illustrating a timing chart in the case where the audio signal is negatively excessive.

FIG. 14 is a view illustrating the change of the voltage across a first capacitor at the time when the audio signal is restored from a state where it is negatively excessive to a normal state, at a state where the charging start voltage has decreased.

DETAILED DESCRIPTION OF THE PREFERRED EMBODIMENTS

Hereinafter, preferred embodiments of the present invention will be described, in detail, with reference to the attached drawings.

FIG. 1 is a structure view of a switching amplifier to which a pulse width modulation (PWM) circuit according to the present invention is applied. FIG. 2 is a block circuit diagram illustrating a first embodiment of the pulse width modulation circuit illustrated in FIG. 1.

The switching amplifier includes a pulse width modulation circuit 1 connected to an audio-signal source AU, a switching circuit 2, a low-pass filter circuit 3, and a first power supply 4 and a second power supply 5 which supply positive and negative power-supply voltages +EB and −EB. A speaker (not illustrated), as a load RL, is connected to the output of the low-pass filter 3.

The pulse width modulation circuit 1 converts an audio signal $e_s$ as an input signal outputted from the audio-signal source AU into a pulse-width modulated signal PWMout and outputs it. The pulse-width modulated signal PWMout outputted from the pulse width modulation circuit 1 is inputted to the switching circuit 2.

The switching circuit 2 includes a switch device SW-A which is controlled in ON and OFF operations through the pulse-width modulated signal PWMout, an inverter 2a which inverts the phase of the pulse-width modulated signal PWMout outputted from the pulse width modulation circuit 1, a switch device SW-B which is controlled in ON and OFF operations through the pulse-width modulated signal PWMout' with the inverted phase outputted from the inverter 2a, and counter-current prevention diodes D-A and D-B which are connected to the opposite ends of the respective switch devices SW-A and SW-B.

In the switching circuit 2, the positive and negative power-supply voltages +EB and −EB from the first power supply 4 and the second power supply 5 are supplied through the switch devices SW-A and SW-B to the load RL. The switch device SW-A and the switch device SW-B are alternately subjected to ON and OFF operations through the pulse-width modulated signal PWMout and the pulse-width modulated signal PWMout' and, accordingly, the power-supply voltage +EB and the power-supply voltage −EB are alternately supplied to the low-pass filter circuit 3 and the load RL. Namely, the load RL is supplied, through the low-pass filter 3, with a rectangular-wave voltage which is varied in level between +EB and −EB and has the same duty ratio as that of the pulse-width modulated signal PWMout.

The low-pass filter circuit 3 is made up of an LC circuit having a coil L0 and a capacitor C0. The low-pass filter circuit 3 is a circuit which eliminates high-frequency components from the rectangular-wave voltage inputted from the switching circuit 2 and has a cut-off frequency of 60 kHz, for example. The low-pass filter circuit 3 outputs an AC voltage signal (an AC voltage signal with substantially the same waveform as that of the audio signal $e_s$) resulted from the demodulation of the pulse-width modulated signal PWMout, and this AC voltage signal is supplied to the load RL, so that the audio signal $e_s$ is outputted as sounds.

The pulse width modulation circuit 1 includes a reference-clock generation circuit 11, a dead-time generation circuit 12, a trailing-edge detection circuit 13, a charging-current generation circuit 14, first to fourth switches SW1 to SW4, first and second capacitors C1 and C2, a discharging constant-current source 15, a current bypass circuit 16, first and second RS flip flop circuits 17 and 18, and a signal output circuit 19, as illustrated in FIG. 2.

The pulse width modulation circuit 1 has basically the same structure as that of the pulse width modulation circuit 51 illustrated in FIG. 11, as is apparent from the comparison between FIG. 2 and FIG. 11. Namely, the reference-clock generation circuit 11, the dead-time generation circuit 12 and the trailing-edge detection circuit 13 correspond to the reference-clock generation circuit 54, the dead-time generation circuit 55 and the trailing-edge detection circuits 56 in the pulse width modulation circuit 51. Further, the charging-current generation circuit 14, the constant-current source 15 and the current bypass circuit 16 correspond to the charging-current generation circuit 57, the constant-current source 58 and the current bypass circuit 59, respectively, in the pulse width modulation circuit 51. Further, the first to fourth switches SW1 to SW4 and the first and second capacitors C1 and C2 correspond to the first to fourth switches SW11 to SW14 and the first and second capacitors C11 and C12, respectively, in the pulse width modulation circuit 51. The first and second RS flip flop circuits 17 and 18 and the signal output circuit 19 correspond to the first and second RS flip flop circuits 60 and 61 and the signal output circuit 62, respectively, in the pulse width modulation circuit 51.

Further, the pulse width modulation circuit 1 according to the first embodiment is different from the pulse width modulation circuit 51, only in the circuit structure of the charging-current generation circuit 14, and this different circuit structure is a characteristic point of the present invention. The characteristic point will be described, later.

The pulse width modulation circuit 1 converts the audio signal $e_s$ into a pulse-width modulated signal PWMout, on the basis of the following operation principles.

(1) A charging current Ij for charging the first and second capacitors C1 and C2 is generated by the charging-current generation circuit 14 from the audio signal $e_s$ inputted from the outside.

(2) The first or second capacitor C1 or C2 is charged with the charging current Ij within each charging time interval, and the electric charge accumulated in the first or second capacitor C1 or C2 is discharged with a constant discharging current Id within each discharging time interval, assuming that the former half cycle and the latter half cycle, out of a single cycle of a reference clock MCLK, are a charging time interval and a discharging time interval, respectively, for the first capacitor C1, while the former half cycle and the latter half cycle are a discharging time interval and a charging time interval, respectively, for the second capacitor C2.

(3) During each discharging time interval for the first or second capacitor C1 or C2, a pulse signal with a pulse width equal to the discharging time interval required for changing the voltage across the first or second capacitor C1 or C2 to a predetermined threshold voltage Vth from the start of discharging (the end of charging) is generated.

(4) The pulse signals alternately generated during the respective half cycles of the reference clock MCLKA are synthesized to generate a pulse-width modulated signal PWMout.

The reference-clock generation circuit 11 is a circuit which generates the aforementioned reference clock MCLK. The reference clock MCLK is a clock signal with a constant period and a duty ratio of about 50% and serves as a reference signal for first and second switching signals φ1 and φ2 for controlling the ON and OFF operations of the first and second switches SW1 and SW2. Further, the reference clock MCLK serves as a reference signal for defining the period of the pulse-width modulated signal PWMout. The reference-clock generation circuit 11 outputs the reference clock MCLK to the dead-time generation circuit 12. Also, the reference-clock generation circuit 11 can be provided outside of the pulse width modulation circuit 1 and can be structured to supply the reference clock MCLK as an external clock signal to the pulse width modulation circuit 1.

The dead-time generation circuit 12 is a circuit which generates a first switching signal φ1 and a second switching signal φ2, on the basis of the reference clock MCLK from the reference-clock generation circuit 11. The second switching signal φ1 has the opposite phase from that of the first switching signal φ2, but the timing of the inversion of the level of the second switching signal φ2 is deviated by a predetermined time ΔT (a dead time) from the timing of the inversion of the level of the first switching signal φ1, in order to prevent the timing of the trailing edges and the leading edges of the second switching signal φ2 from coinciding with the timing of the leading edges and the trailing edges of the first switching signal φ1.

Namely, as illustrated in FIGS. 5 and 6(*a*) and (*b*), the first switching signal φ1 is a signal which is inverted from a low level to a high level at timing delayed by the predetermined time ΔT from the timing when the reference clock MCLK is inverted from a low level to a high level and, also, is inverted from the high level to the low level at the same timing as the timing when the reference clock MCLK is inverted from the high level to the low level. On the other hand, as illustrated in FIGS. 5 and 6(*a*) and (*c*), the second switching signal φ2 is a signal which is inverted from a high level to a low level at the same timing as the timing when the reference clock MCLK is inverted from the low level to the high level and, also, is inverted from the low level to the high level at timing delayed by the predetermined time ΔT from the timing when the reference clock MCLK is inverted from the low level to the high level.

Due to the provision of the dead time between the first switching signal φ1 and the second switching signal φ2, as illustrated in FIGS. 5 and 6(*b*) and (*c*), the inversion of the first switching signal φ1 into the high level and the inversion of the second switching signal φ2 into the low level do not occur at the same timing and, also, the inversion of the first switching signal φ1 into the low level and the inversion of the second switching signal φ2 into the high level do not occur at the same timing. Accordingly, at the time the first switch SW1 is changed over from an OFF state to an ON state through the first switching signal φ1 at the time the charging-current generation circuit 14 is connected to the first capacitor C1), the second switch SW2 has been already changed over to an OFF state through the second switching signal φ2 (the charging-current generation circuit 14 has been already disconnected from the second capacitor C1), which prevents the first and second capacitors C1 and C2 from being connected to the charging-current generation circuit 14 at the same time. Further, at the time the second switch SW2 is changed over from an OFF state to an ON state through the second switching signal φ2 (at the time the charging-current generation circuit 14 is connected to the second capacitor C1), the first switch SW1 has been already changed over to an OFF state through the first switching signal φ1 (the charging-current generation circuit 14 has been already disconnected from the first capacitor C1), which prevents the first and second capacitors C1 and C2 from being connected to the charging-current generation circuit 14 at the same time.

Accordingly, the charging current Ij being supplied to the first capacitor C1 from the charging-current generation circuit 14 is prevented from being also supplied to the second capacitor C2 during charging the first capacitor C1. Further, the charging current Ij being supplied to the second capacitor C2 from the charging-current generation circuit 14 is prevented from being also supplied to the first capacitor C1 during charging the second capacitor C2. This can prevent inconvenience of the occurrence of errors in the pulse width of the pulse width modulated signal PWMout, due to the occurrence of errors in the pulse widths of pulse signals outputted from the first and second RS flip flop circuits 17 and 18. The first and second switching signals φ1 and φ2 are outputted to the first and second switches SW1 and SW2 and, also, are outputted to the trailing-edge detection circuit 13.

Further, the dead time provided by the dead-time generation circuit 12 is an extremely short time interval and, therefore, it can be said that the switch SW1 is controlled in ON and OFF substantially through the reference clock MCLK, and the second switch SW2 is controlled in ON and OFF substantially through the clock with the opposite phase from that of the reference clock MCLK.

The trailing-edge detection circuit 13 is a circuit which outputs first and second set signals set 1 and set 2 to be supplied to the first and second RS flip flop circuits 17 and 18, which will be described later. Namely, the trailing-edge detection circuit 13 detects the timing when the first switching signal φ1 descends from the high level to the low level and outputs a signal which momentarily descends to a low level at the detected timing, as a first set signal set 1, to the first RS flip flop circuit 17, as illustrated in FIGS. 5 and 6(*d*). Further, the trailing-edge detection circuit 13 detects the timing when the second switching signal φ2 descends from the high level to the low level and outputs a signal which momentarily descends to a low level at the detected timing, as a second set signal set 1, to the second RS flip flop circuit 18, as illustrated in FIGS. 5 and 6(*e*).

Returning to FIG. 2, the charging-current generation circuit 14 is a circuit which performs voltage-to-current conversion on the audio signal $e_s$ supplied to the pulse width modulation circuit 1 from the audio-signal source AU and adds a supplemental current Imin to the current IS resulted from the conversion to generate a charging current Ij. The charging-current generation circuit 14 is connected to the first and second capacitors C1 and C2 through the first and second switches SW1 and SW2, as will be described later. When the first switch SW1 is at an ON state, the charging-current generation circuit 14 is connected to the first capacitor C1 to charge the first capacitor C1 with the charging current Ij and, when the second switch SW2 is at an ON state, the charging-current generation circuit 14 is connected to the second capacitor C2 to charge the second capacitor C2 with the charging current Ij.

The charging-current generation circuit 14 includes a voltage-to-current conversion portion 14*a* and a supplemental-current generation portion 14*b*. The pulse width modulation circuit 1 according to the first embodiment has a characteristic structure, in that it includes the additional-current generation portion 14*b*.

The voltage-to-current conversion portion 14*a* is a circuit which includes a non-inverting input type voltage-to-current conversion circuit using mainly an OP amplifier 21 and converts the AC voltage signal as the audio signal $e_s$ into an electric current signal. The negative input terminal of the OP amplifier 21 is grounded through a resistance device R3 and, also, is connected to the output terminal through a resistance device R1. Further, the negative input terminal of the OP amplifier 21 is connected to a negative power supply [−Vcc] to generate a bias voltage for the OP amplifier 21. Due to the bias voltage, at a no-input state (a state where the audio signal $e_s$ has an amplitude of 0), the OP amplifier 21 outputs a DC bias current Ic.

Further, the OP amplifier 21 is connected, at its output terminal, to the emitter terminal of a PNP-type transistor Q, through a diode D1 and a resistance device R5. Further, the transistor Q is connected at its collector terminal to the first switch SW1 and the second switch SW2 and is supplied, at its base, with a bias voltage V1 from a voltage source 22.

The voltage-to-current conversion portion 14*a* converts the audio signal $e_s$ into a current ±Δi which is expressed as ±Δi=Gm*(±E), assuming that the conversion conductance of the voltage-to-current conversion portion 14*a* is Gm, and the amplitude of the audio signal $e_s$ is ±E. The voltage-to-current circuit is structured to output a DC bias current Ic at a state where E equals to 0 and, therefore, the OP amplifier 21 outputs a current IS=Ic±Δi generated by adding the current Δi to the DC bias current Ic.

FIG. 3 is a view illustrating the relationship between the audio signal $e_s$ inputted to the OP amplifier 21 and the output current IS.

As illustrated in FIG. 3(*b*), the current IS resulted from the conversion which is outputted from the voltage-to-current conversion circuit is varied with the amplitude E of the audio signal $e_s$ within a range equal to or larger than 0. Even if the amplitude +E of the audio signal $e_s$ at its positive side is excessively large (see the portion of +E≧+Es in FIG. 3(*a*)), the current IS resulted from the conversion is a current Ic+Δi=Ic+Gm*E which varies with the amplitude +E of the audio signal $e_s$, as illustrated in FIG. 3(*b*). However, when the amplitude −E of the audio signal $e_s$ at is negative side is extremely large (see the portion of −E≦−Es in FIG. 3(*a*)), the current IS resulted from the conversion is clipped to "0" (see the portion (a)).

Accordingly, when the amplitude E of the audio signal $e_s$ is varied over a voltage range A in FIG. 3(*a*) (a range equal to or larger than −Es), the OP amplifier 21 outputs a current IS (=Ic±Δi=Ic±Gm*E) which varies with the amplitude ±E of the audio signal $e_s$. On the other hand, when the amplitude −E of the audio signal $e_s$ is varied over a voltage range B (a range equal to or smaller than −Es) in FIG. 3(*a*), the OP amplifier 21 outputs no electric current, regardless of the variation.

Further, in FIG. 3(*b*), Ip is expressed as Ip=2Ic, since there are the relationships of Ic+Gm*Es=Ip and Ic−Gm*Es=0. Further, even when the amplitude +E of the audio signal $e_s$ at its positive side is excessively large and the charging current Ij for the first and second capacitors C1 and C2 becomes equal to or higher than Ip, the waveforms during charging the first and second capacitors C1 and C2 are as illustrated by a two-dot chain line in FIG. 12(*e*), and the charging start voltage Vc across the first capacitor C1 is substantially clipped to the power-supply voltage +Vcc for the first and second RS flip flop circuits 17 and 18.

The supplemental-current generation portion 14*b* generates a supplemental current Imin and includes a diode D1, a positive power supply [+Vcc] and a resistance device R4. The diode D1 is connected between the output terminal of the OP amplifier 21 and the resistance device R5, such that its anode is closer to the OP amplifier 21. The resistance device R4 is connected between the power supply [+Vcc] and the cathode of the diode D1.

Hereinafter, the magnitude of the supplemental current Imin will be described.

As previously described above in the background section, in the case of the pulse width modulation circuit 5 illustrated in FIG. 11, when the amplitude −E of the audio signal $e_s$ at its negative side is varied within a range of −E<−Es, the charging current Ij becomes "0" and, accordingly, for example, even when the charging-current generation circuit 57 is connected to the first capacitor C11 during a charging time interval, the first capacitor C11 is not charged substantially, and the voltage across the first capacitor C11 does not rise from the charging start voltage Va. Further, if this state continues over several cycles to several tens of cycles of the reference clock MCLK, this will induce the problem of stepwise decreases of the charging start voltage across the first capacitor C11. This fact also applies to the second capacitor C12.

The charging start voltage Va is decreased in a stepwise manner, since the following operations are performed for, for example, the first capacitor C11. Namely, since the charging current Ij becomes "0" during each charging time interval, substantially no electric charge is accumulated in the first capacitor C11 (the voltage across the first capacitor C11 does not rise) during each charging time interval and, therefore, the charging end voltage Vc becomes equal to the charging start voltage Va. The charging start voltage is lower than the threshold voltage Vth, which maintains, at the low level, the input terminal of the first RS flip flop circuit 60 to which a first reset signal res1 is inputted. At this state, if a first set signal set1 is inputted to the first RS flip flop circuit 60 at the end of the charging time interval (at the start of discharging), this momentarily brings both the input terminals of the first RS flip flop circuit 60 into a low level (an unstable state) at the same time, thereby momentarily bringing the third switching signal φ3 outputted from the first flip flop circuit 60 into a high level. Consequently, the electric charge accumulated in the first capacitor C11 is momentarily discharged with a discharging current Id, thereby slightly decreasing the voltage across the first capacitor C11. This fact also applies to the second capacitor C12.

Accordingly, in order to overcome the aforementioned problem, it is necessary to maintain, at the high level, the input terminals of the first and second RS flip flop circuits 60 and 61 to which first and second reset signals res1 and res2 are inputted, at the end of each charging time internal, namely at the time the first and second set signals set1 and set2 are inputted to the first and second RS flip flop circuits 60 and 61. Namely, it is necessary to supply a charging current Ij larger than "0", in order to raise the voltage across the first or second capacitor C11 or C12 to equal to or higher than the threshold voltage Vth during each charging time interval for certainly maintaining, at the high level, the input terminal to which the first and second signals res1 and res2 are inputted, at the time the first and second set signals set1 and set2 are inputted to the first and second RS flip flop circuits 60 and 61.

The supplemental current Imin is supplied from the supplemental-current generation portion 14b from the aforementioned perspective, and the magnitude of the supplemental current Imin is determined according to the following equation (1).

$$I min = \frac{\Delta t}{T} \cdot Id \quad (1)$$

Further, the equation (1) is determined as follows. Namely, the amount of electric charge accumulated in the first or second capacitor C1 or C2 during a charging time interval T is expressed as the following equation (2), assuming that the charging time interval is T, the discharging current supplied from the constant-current source 15 is Id, the time period during which momentary discharging from Vth to Va at the end of charging occurs is Δt, the voltage difference between the charging start voltage Va and the threshold voltage Vth is Δv, and the capacitance of the first or second capacitor C1 or C2 is C, as illustrated in FIG. 4. In this case, more specifically, Δt means the short lag time period from the timing when the voltage across the first or second capacitor C1 or C2 has decreased to the threshold voltage Vth to the timing when the third or fourth switch SW3 or SW4 separates the constant-current source 15 since the third or fourth switching signal φ3 or φ4 is inverted to the low level, after the voltage across the first or second capacitor C1 or C2 has decreased to the threshold voltage Vth.

$$\Delta Q = I min \cdot T = C \cdot \Delta v \quad (2)$$

The amount ΔQ of electric charge is equal to the amount Id*Δt of electric charge discharged from the first or second capacitor C1 or C2 during the discharging time interval Δt and, therefore, the following equation (3) holds, and the equation (1) is obtained by deforming the equation (3).

$$I min \cdot T = Id \cdot \Delta t \quad (3)$$

The magnitude of the supplemental current Imin is determined according to the equation (1), and is adjusted by the resistance value of the resistance device R4 in the supplemental-current generation portion 14b.

Further, the aforementioned inconvenience can be overcome when the supplemental current Imin is equal to or more than the value determined according to the equation (1). However, if the value of the supplemental current is increased, this will narrow the range of the charging current Ij outputted from the charging-current generation circuit 14, since the supplemental current is flowed by being included in the charging current Ij. Namely, if there is no supplemental current Imin, the range of the charging current Ij outputted from the charging-current generation circuit 14 is a range equal to or more than 0 as illustrated by A' in FIG. 3(b). However, when the supplemental current Imin is flowed, the range of the charging current Ij is narrowed to a range equal to or more than Imin, thereby inducing the inconvenience of narrowness of the range within which PWM modulation can be normally performed. Accordingly, in the pulse width modulation circuit 1 according to the first embodiment, the supplemental current Imin is set to a minimum value, out of possible current values.

Returning to FIG. 2, if the output current IS from the OP amplifier 21 becomes "0", namely if a negatively-excessive signal of −E≦−Es as an audio signal $e_s$ is inputted to the OP amplifier 21, the diode D1 is brought into an OFF state. Accordingly, when the amplitude of the audio signal $e_s$ varies within the voltage range A of FIG. 3(a), the output current IS from the OP amplifier 21 is larger than "0" and, therefore, the diode D1 is at an ON state, which causes the charging-current generation circuit 14 to output a charging current Ij generated by adding the supplemental current Imin to the current resulted from the conversion (Ic±Δi).

If the amplitude −E of the audio signal $e_s$ is changed to within the voltage range B, namely if the output current IS from the OP amplifier 21 becomes "0", this brings the diode D1 into an OFF state, which causes the charging-current generation circuit 14 to output only the supplemental current Imin, as the charging current Ij. Namely, the charging current Ij supplied from the charging-current generation circuit 14 is varied with the amplitude of the audio signal $e_s$, and the range of the change thereof is a range equal to or larger than Imin, which prevents the charging current Ij from being lower than Imin.

Further, when the amplitude −E of the audio signal $e_s$ varies within the voltage range B, the output current IS from the OP amplifier 21 is "0" and, therefore, the charging current Ij is substantially equal to the supplemental current Imin. In this case, in the charging-current generation circuit 14 illustrated in FIG. 2, in order to prevent the supplemental current Imin from flowing toward the OP amplifier 21, the diode D1 electrically separates the voltage-to-current conversion portion 14a.

The constant-current source 15 is for discharging the electric charge accumulated in the first or second capacitor C1 or C2 toward the negative power supply [−Vcc] with the discharging current Id which is a constant current. Namely, as will be described later, the constant-current source 15 is connected to the first or second capacitor C1 or C2 through the third or fourth switch SW3 or SW4, respectively. If the switch SW3 is subjected to an ON operation so that the constant-current source 15 is connected to the first capacitor C1, the electric charge accumulated in the first capacitor C1 is discharged toward the negative power supply [−Vcc] with the discharging current Id. If the switch SW4 is subjected to an ON operation so that the constant-current source 15 is connected to the second capacitor C2, the electric charge accumulated in the second capacitor C2 is discharged toward the negative power supply [−Vcc] with the discharging current Id.

The current bypass circuit 16 includes a diode D2 and a voltage source 23. The current bypass circuit 16 is for flowing a discharge current Id even when the constant-current source 15 is not electrically connected to the first or second capacitors C1 or C2 through the third or fourth switches SW3 or SW4. Namely, when the constant-current source 15 is not electrically connected to the first or second capacitor C1 or C2 through the third or fourth switch SW3 or SW4, the diode D2 is at an ON state, and the voltage source 23 is connected to the constant-current source 15. At this time, the voltage at the cathode side of the diode D2 is higher than the negative power supply [−Vcc] and, therefore, a discharging current Id flows toward the negative power supply [−Vcc] through the diode D2 from the voltage source 23.

At this state, for example, if the third switch SW3 is turned on to connect the first capacitor C1 to the constant-current source 15, since the voltage across the first capacitor C1 is higher than the voltage at the cathode side of the diode D2, the diode D2 is brought into an OFF state, thereby changing over the flow path for the flow of the discharging current Id, from the voltage source 23 to the first capacitor C1. Namely, at the same timing as the timing when the third switch SW3 is turned on, the operation for discharging the electric charge accumulated in the first capacitor C1 with the discharging current Id is started. Further, the same operation is performed when the fourth switch SW4 is turned on and, at the same timing as the timing when the fourth switch SW4 is turned on, the operation for discharging the electric charge accumulated in the second capacitor C2 with the discharging current Id is started.

The first and second switches SW1 and SW2 are switches for controlling the operation for charging the first and second capacitors C1 and C2 with the charging current Ij from the charging-current generation circuit 14. The first switch SW1 is connected at its one end to the output end of the charging-current generation circuit 14 (the collector terminal of the transistor Q) and also is connected at the other end to one end of the first capacitor (see the point A in FIG. 2). When the first switch SW1 is subjected to an ON operation (when it is brought into a closed state), a path for charging the first capacitor C1 is formed. The second switch SW2 is connected at its one end to the output end of the charging-current generation circuit 14 (the collector terminal of the transistor Q) and also is connected at the other end to one end of the second capacitor (see the point A' in FIG. 2). When the second switch SW2 is subjected to an ON operation (when it is brought into a closed state), a path for charging the first capacitor C2 is formed.

The ON and OFF operations of the first and second switches SW1 and SW2 are performed through the first and second switching signals $\phi 1$ and $\phi 2$ which are outputted from the dead-time generation circuit 12. Namely, an ON operation is performed on the first switch SW1 when the first switching signal $\phi 1$ is at the high level, while an OFF operation is performed thereon when the first switching signal $\phi 1$ is at the low level, as illustrated in FIG. 5 and FIG. 6(*b*). Further, an ON operation is performed on the second switch SW2 when the second switching signal $\phi 2$ is at the high level, while an OFF operation is performed thereon when the second switching signal $\phi 2$ is at the low level, as illustrated in FIG. 5 and FIG. 6(*c*).

The third and fourth switches SW3 and SW4 are switches for controlling the operation for discharging the first and second capacitors C1 and C2 with the discharging current Id from the constant-current source 15. The third switch SW3 is connected at its one end to the constant-current source 15 and also is connected at the other end to one end of the first capacitor (see the point A in FIG. 2). When the third switch SW3 is subjected to an ON operation (when it is brought into a closed state), a path for discharging the first capacitor C1 is formed. The fourth switch SW4 is connected at its one end to the constant-current source 15 and also is connected at the other end to one end of the second capacitor (see the point A' in FIG. 2). When the fourth switch SW4 is subjected to an ON operation (when it is brought into a closed state), a path for discharging the second capacitor C2 is formed.

The ON and OFF operations of the third and fourth switches SW3 and SW4 are performed through the third and fourth switching signals $\phi 3$ and $\phi 4$ which are outputted from the first and second RS flip flop circuits 17 and 18. Namely, an ON operation is performed on the third switch SW3 when the third switching signal $\phi 3$ is at the high level, while an OFF operation is performed thereon when the third switching signal $\phi 3$ is at the low level, as illustrated in FIG. 5 and FIG. 6(*h*). Further, an ON operation is performed on the fourth switch SW4 when the fourth switching signal $\phi 4$ is at the high level, while an OFF operation is performed thereon when the fourth switching signal $\phi 4$ is at the low level, as illustrated in FIG. 5 and FIG. 6(*i*).

The first and second capacitors C1 and C2 are for generating a time interval corresponding to the amplitude (the momentary voltage value) of the audio signal $e_s$. More specifically, during the ON time interval (a constant time interval) of the first switching signal $\phi 1$, an ON operation is performed on the first switch SW1 (at this time, an OFF operation is performed on the third switch SW3). While the first switch is turned on, the first capacitor C1 is charged with the charging current Ij(=Ic±Δi+Imin, a current corresponding to the amplitude (the momentary voltage value) of the audio signal $e_s$) from the charging-current generation circuit 14, and the voltage across the first capacitor C1 is raised from the reference voltage (the charging start voltage) Va to the voltage corresponding to the amplitude of the audio signal $e_s$ (the charging end voltage). After the end of the charging operation, an ON operation is performed on the third switch SW3 (at this time, an OFF operation is performed on the first switch SW1), which causes the accumulated electric charge to be discharged with the constant discharging current Id. Further, through this discharging operation, the discharging time interval required for decreasing the voltage across the first capacitor C1 from the charging end voltage Vc to the predetermined threshold voltage Vth is generated as a time interval corresponding to the amplitude (the momentary voltage value) of the audio signal $e_s$.

Further, the predetermined threshold voltage Vth is a threshold voltage for the logic levels of the first and second RS flip flop circuits 17 and 18 and is a voltage equal to about ½ the power supply voltage +Vcc supplied to the first and second RS flip flop circuits 17 and 18. For example, in the case where the voltage for driving the first and second RS flip flop circuits 17 and 18 is +5 [v], the threshold voltage Vth is about +2.5 [v]. Further, the charging start voltage Va is a voltage slightly lower than the threshold voltage Vth.

An ON operation is performed on the third switch SW3 during the ON time interval (a constant time interval) of the third switching signal φ3 (at this time, an OFF operation is performed on the fourth switch SW4). While the third switch is turned on, the second capacitor C2 is charged with the charging current Ij from the charging-current generation circuit 14, and the voltage across the second capacitor C2 is raised from the charging start voltage Va to the voltage Vc corresponding to the amplitude of the audio signal $e_s$ (the charging end voltage). After the end of the charging operation, an ON operation is performed on the fourth switch SW4 (at this time, an OFF operation is performed on the second switch SW2), which causes the accumulated electric charge to be discharged with the constant discharging current Id. Further, through this discharging operation, the discharging time interval required for decreasing the voltage across the second capacitor C2 from the charging end voltage Vc to the predetermined threshold voltage Vth is generated as a time interval corresponding to the amplitude (the momentary voltage value) of the audio signal $e_s$.

The first RS flip flop circuit 17 is a circuit which, during each discharging time interval for the first capacitor C1, generates a pulse signal with a pulse width equal to the discharging time interval for the first capacitor C1 and, also, generates a third switching signal φ3.

The first RS flip flop circuit 17 is an RS flip flop circuit having two NAND gates (a first NAND circuit NA1 and a second NAND circuit NA2). The voltage across the first capacitor C1 is inputted as a first reset signal res1 to the first NAND circuit NA1, and the first NAND circuit NA1 outputs an output rsout1. Further, a first set signal set1 (a signal which momentarily descends to a level lower than the threshold voltage Vth) outputted from the trailing-edge detection circuit 13 is inputted to the second NAND circuit NA2, and the second NAND circuit NA2 outputs a third switching signal φ3.

If the first set signal set1 is inputted to the first RS flip flop circuit 17, the first RS flip flop circuit 17 inverts the output rsout1 to the low level and, also, inverts the third switching signal φ3 to the high level. If the voltage across the first capacitor C1 is brought into a low level (equal to or lower than the threshold voltage Vth), namely if a first reset signal res1 is inputted thereto, the first RS flip flop circuit 17 inverts the output rsout1 to the high level and, also, inverts the third switching signal φ3 to the low level. The timing of the input of the first set signal set1 corresponds to the timing when the discharging of the first capacitor C1 is started, and the timing of the input of the first reset signal res1 corresponds to the timing when the voltage across the first capacitor C1 has decreased to the threshold voltage vth and, accordingly, the time interval during which the output rsout1 is at the low level corresponds to the time interval during which the first capacitor C1 is discharged.

Accordingly, during each discharging time interval for the first capacitor C1, the first NAND circuit NA1 in the first RS flip flop circuit 17 outputs, from its output terminal, a pulse signal with a pulse width equal to the discharging time interval for the first capacitor C1, as an output rsout1.

The second RS flip flop circuit 18 is a circuit which, during each discharging time interval for the second capacitor C2, generates a pulse signal with a pulse width equal to the discharging time interval for the second capacitor C2 and generates a fourth switching signal φ4.

Similarly to the first RS flip flop circuit 17, the second RS flip flop circuit 18 is an RS flip flop circuit having two NAND gates (a third NAND circuit NA3 and a fourth NAND circuit NA4). The voltage across the second capacitor C2 is inputted as a second reset signal res2 to the third NAND circuit NA3, and the third NAND circuit NA3 outputs an output rsout2. Further, a second set signal set2 (a signal which momentarily descends to a level lower than the threshold voltage Vth) outputted from the trailing-edge detection circuit 13 is inputted to the fourth NAND circuit NA4, and the fourth NAND circuit NA4 outputs a fourth switching signal φ4.

If the second set signal set2 is inputted to the second RS flip flop circuit 18, the second RS flip flop circuit 18 inverts the output rsout1 to the low level and, also, inverts the fourth switching signal φ4 to the high level. If the voltage across the second capacitor C2 is brought into a low level (equal to or lower than the threshold voltage Vth), namely if the second reset signal res2 is inputted thereto, the second RS flip flop circuit 18 inverts the output rsout2 to the high level and, also, inverts the fourth switching signal φ4 to the low level. The timing of the input of the second set signal set2 corresponds to the timing when the discharging of the second capacitor C2 is started, and the timing of the input of the second reset signal res2 corresponds to the timing when the voltage across the second capacitor C2 has decreased to the threshold voltage vth and, accordingly, the time interval during which the output rsout2 is at the low level corresponds to the time interval during which the second capacitor C2 is discharged.

Accordingly, during each discharging time interval for the second capacitor C2, the third NAND circuit NA3 in the second RS flip flop circuit 18 outputs, from its output terminal, a pulse signal with a pulse width equal to the discharging time interval for the second capacitor C2, as an output rsout2.

The signal output circuit 19 is a circuit which synthesizes the output rsout1 outputted from the first RS flip flop circuit 17 and the output rsout2 outputted from the second RS flip flop circuit 18. The signal output circuit 19 is made up of a NAND gate (a fifth NAND circuit NA5). The rsout1 is a signal which has pulse signals (pulse signals with a pulse width equal to a discharging time interval for the first capacitor C1) during the time intervals during which the reference clock MCLK is at the low level, while the rsout2 is a signal which has pulse signals (pulse signals with a pulse width equal to a discharging time interval for the second capacitor C2) during the time intervals during which the reference clock MCLK is at the high level. Accordingly, the signal output circuit 19 outputs, as a pulse width modulated signal PWMout, pulse signals generated by alternately combining the pulse signals of the output rsout1 and the pulse signals of the output rsout2 (a signal having a series of pulses with a pulse width corresponding to the amplitude (the momentary voltage value) of the audio signal eS with a period equal to the half the period of the reference clock MCLK).

Next, operations of the pulse width modulation circuit 1 according to the first embodiment will be described in brief, with reference to time charts of FIGS. 5 to 6.

FIG. 5 is a time chart in the case where the amplitude of the audio signal $e_s$ varies within a normal range (the range from −Es to +Es).

The high-level time intervals and the low-level time intervals of the first switching signal φ1 correspond to the charging time intervals and the discharging time intervals for the first capacitor C1, respectively. If the first switching signal φ1 is inverted to the high level, this causes the first switch SW1 to connect the charging-current generation circuit 14 to the first capacitor C1, thereby starting charging the first capacitor C1 with the charging current Ij from the charging-current generation circuit 14. This charging operation is continued until the first switching signal φ1 is inverted to the low level and the first switch SW1 separates the charging-current generation circuit 14 (see FIGS. 5 (b) and (f)).

If the first switching signal φ1 is inverted to the low level to cause the transition to a discharging time interval, a first set signal set1 resulted from the detection of this inversion to the low level causes the third switching signal φ3 outputted from the first RS flip flop circuit 17 to be inverted to the high level, which causes the third switch SW3 to connect the constant-current source 15 to the first capacitor C1, thereby starting discharging the first capacitor C1 with the discharging current Id from the constant-current source 15. This discharging operation is continued until the voltage across the first capacitor C1 has decreased to the threshold voltage Vth and, thus, the third switching signal φ3 has been inverted to the low level, thereby causing the third switch SW3 to separate the constant-current source 15 (see FIGS. 5 (b), (d) and (f)).

During each discharging time interval, the first RS flip flop circuit 17 outputs, as an output rsout1, a pulse signal which is inverted to the low level at the same timing as the timing when a first set signal set1 is inputted thereto and, then, is inverted to the high level at the same timing as the timing when the voltage across the first capacitor C1, which is inputted as the first reset signal res1 thereto, has decreased to the threshold voltage Vth. Namely, a pulse signal with a pulse width corresponding to the amplitude (the momentary voltage value) of the audio signal $e_s$ is generated (see FIG. 5 (j)).

The high-level time intervals and the low-level time intervals of the second switching signal φ2 correspond to the charging time intervals and the discharging time intervals for the second capacitor C2, respectively. If the dead time is neglected, the second switching signal φ2 is the same signal as the first switching signal φ1 but has the opposite phase therefrom and, accordingly, the same charging and discharging operations as the charging and discharging operations for the first capacitor C1 are performed for the second capacitor C2, such that they are deviated by the half the period of the first switching signal φ1 (see FIGS. 5 (c), (e), (g) and (i)).

Accordingly, during each discharging time interval for the second capacitor C2, the second RS flip flop circuit 18 outputs, as an output rsout2, a pulse signal which is inverted to the low level at the same timing as the timing when a second set signal set2 is inputted thereto and, then, is inverted to the high level at the same timing as the timing when the voltage across the second capacitor C2, which is inputted as the second reset signal res2 thereto, has decreased to the threshold voltage Vth. Namely, a pulse signal with a pulse width corresponding to the amplitude (the momentary voltage value) of the audio signal $e_s$ is generated (see FIG. 5 (k)).

The signal output circuit 19 synthesizes the output rsout1 and the output rsout2 outputted from the first and second flip flop circuits 17 and 18 and output the signal resulted from the synthesis, as a pulse-width modulated signal PWMout (a signal generated by synthesizing the waveform of the output rsout1 and the waveform of the output rsout2) (see FIG. 5(l)).

When the amplitude of the audio signal $e_s$ varies within the normal range (the range from −Es to +Es), the voltage across the first or second capacitor C1 or C2 is certainly raised to the charging end voltage Vc which is higher than the threshold voltage Vth during each charging time interval. Accordingly, even after the transition to the discharging time interval, the voltage across the first or second capacitor C1 or C2 normally becomes the charging start voltage Va, which causes the voltage across the first or second capacitor C1 or C2 to be certainly maintained at the charging start voltage Va after the discharging is stopped. This can stabilize, at Va, the charging start voltage across the first or second capacitor C1 or C2, in each charging time interval (see FIGS. 5 (f) and (g)).

FIG. 6 is a time chart in the case where the amplitude of the audio signal $e_s$ varies within a positively-excessive range (a range equal to or larger than +Es).

The processing for generating a pulse-width modulated signal PWMout in the case where the amplitude of the audio signal $e_s$ varies within a positively-excessive range (a range equal to or larger than +Es) is not different from that in the case where the amplitude of the audio signal $e_s$ varies within the normal range (the range from −Es to +Es) and, therefore, will not be described in detail, and only the different points will be described.

When the amplitude of the audio signal $e_s$ varies within the normal range (the range of −Es to +Es), the charging current Ij varies with the amplitude of the audio signal $e_s$ and, accordingly, the waveforms of the voltages across the first and second capacitors C1 and C2 illustrated in FIGS. 5 (f) and (g) vary with the amplitude of the audio signal $e_s$. More specifically, the charging end voltage Vc to which the voltages across the first and second capacitors C1 and C2 are raised during the charging time intervals is varied within the range of Vth (>0) to Vcc, according to the amplitude of the audio signal $e_s$. Accordingly, the waveform of the voltage across the first capacitor C1 varies within the range sandwiched between the voltage waveform illustrated by a chain line N1 and the waveform illustrated by a dotted line N2. This also applies to the waveform of the voltage across the second capacitor C2.

On the other hand, when the amplitude of the audio signal $e_s$ varies within a positively-excessive range (a range equal to or larger than +Es), the charging end voltage Vc across the first and second capacitors C1 and C2 is clipped to the power-supply voltage +Vcc for the first and second RS flip flop circuits 17 and 18. Accordingly, as illustrated in FIGS. 6 (f) and (g), the waveforms during discharging the first and second capacitors C1 and C2 are the same as the waveform during discharging, out of the voltage waveform illustrated by the chain line N1 in FIG. 5 (f).

When the amplitude of the audio signal $e_s$ varies within a positively-excessive range (a range equal to or larger than +Es), similarly to when the amplitude of the audio signal eS varies within the normal range (the range from −Es to +Es), the voltage across the first or second capacitor C1 or C2 is certainly raised to the charging end voltage Vc which is higher than the threshold voltage Vth, during each charging time intervals. Even after the transition to the discharging time interval, the voltage across the first or second capacitor C1 or C2 normally becomes the charging start voltage Va. Accordingly, the voltage across the first or second capacitor C1 or C2 can be certainly maintained at the charging start voltage Va after the stop of discharging. This can stabilize, at Va, the charging start voltage across the first or second capacitor C1 or C2, in each charging time interval (see FIGS. 6 (f) and (g)).

FIG. 7 is a time chart in the case where the amplitude of the audio signal $e_s$ varies within a negatively-excessive range (a range equal to or smaller than −Es).

The processing for generating a pulse-width modulated signal PWMout in the case where the amplitude of the audio signal $e_s$ varies within a negatively-excessive range (a range equal to or smaller than −Es) is not different from that in the case where the amplitude of the audio signal $e_s$ varies within the normal range (the range of −Es to +Es) and, therefore, will not be described in detail, and only the different points will be described.

When the amplitude of the audio signal $e_s$ varies within a negatively-excessive range (a range equal to or smaller than −Es), the charging current Ij is clipped to Imin regardless of the amplitude −E of the audio signal $e_s$. Accordingly, as illustrated in FIGS. 7 (f) and (g), the waveforms of the voltages across the first and second capacitors C1 and C2 are the same as the voltage waveform illustrated by the dotted line N2 in FIGS. 5 (f) and (g).

Even when the amplitude of the audio signal $e_s$ varies within a negatively-excessive range (a range equal to or smaller than −Es), the first and second capacitors C1 and C2 are certainly charged with the supplemental current Imin until the voltages across them are raised to equal to or higher than the threshold voltage Vth, during the charging time intervals. Accordingly, even though the voltage across the first or second capacitor C1 or C2 decreases during the time lag Δt which occurs at the time of the transition to each discharging time interval, the voltages across the first and second capacitors C1 and C2 are prevented from decreasing to below the charging start voltage Va.

This prevents both the input terminals of the first and second RS flip flop circuits 17 and 18 from being brought into the low level at the time first and second set signals set1 and set2 are inputted to the first and second RS flip flop circuits 17 and 18, which prevents stepwise decreases of the charging start voltages across the first and second capacitors C1 and C2 from Va, thereby maintaining, anytime, the charging start voltage Va until the next charging time interval. This can stabilize, at Va, the charging start voltages across the first and second capacitors C1 and C2, in the charging time intervals (FIGS. 7(f) and (g)).

As described above, with the pulse width modulation circuit 1 according to the first embodiment, when the amplitude of the audio signal $e_s$ is brought into a negatively-excessive range (a range equal to or smaller than −Es), the charging current Ij supplied from the charging-current generation circuit 14 is fixed to the supplemental current Imin, which can prevent the voltages across the first and second capacitors C1 and C2 at the start of charging in each charging time interval from varying from the reference charging start voltage Va.

Accordingly, even if the state where the amplitude of the audio signal $e_s$ varies within the negatively-excessive range is continued, the charging start voltage Va across the first and second capacitors C1 and C2 is stabilized. Accordingly, if the amplitude of the audio signal $e_s$ is restored to within the normal range, it is possible to immediately output a PWM modulated signal PWMout with a pulse width corresponding to the amplitude. Therefore, even if the amplitude of the audio signal $e_s$ is suddenly changed to within the normal range from within the negatively-excessive range, it is possible to normally reproduce the audio signal $e_s$ at the time of the occurrence of the sudden change, without inducing distortions.

Further, when a state where the amplitude of the audio signal $e_s$ varies within a positively-excessive range is continued, the charging start voltages across the first and second capacitors C1 and C2 in the respective charging time intervals are not varied from Va, inherently. Accordingly, it goes without saying that it is possible to normally reproduce the audio signal $e_s$ at the time the amplitude of the audio signal $e_s$ is suddenly changed to within the normal range from within the positively-excessive range.

While, in the first embodiment, the circuit for flowing the supplemental current Imin is provided inside the charging-current generation circuit 14, for example, as illustrated in FIG. 8, the supplemental-current generation portion 14b can be eliminated from the charging-current generation circuit 14, and a constant current source 23 can be connected to the collector terminal (the output terminal) of the transistor Q, such that the supplemental current Imin from the constant current source 23 can be flowed toward the first and second switches SW1 and SW2.

With the structure illustrated in FIG. 8, if the amplitude of the audio signal $e_s$ is changed from the normal range to within a negatively-excessive range, the current IS resulted from the conversion which is outputted from the voltage-to-current conversion portion 14a is clipped to "0". Accordingly, when the amplitude of the audio signal $e_s$ is changed to within the negatively-excessive range, the charging current Ij equals to Imin, and the charging current Ij supplied to the first or second capacitor C1 or C2 is substantially the same as that in the first embodiment.

Further, with the structure illustrated in FIG. 8, even when the current IS resulted from the conversion becomes 0, the transistor Q prevents the supplemental current Imin from flowing toward the voltage-to-current conversion portion 14a, which eliminates the necessity of providing a diode for counter-current prevention, as illustrated in FIG. 2.

FIG. 9 is a block circuit diagram illustrating a second embodiment of the pulse width modulation circuit. Further, in FIG. 9, there are illustrated only the portions different from FIG. 2, and the reference clock generation circuit 11, the dead-time generation circuit 12, the trailing-edge circuit 13, the first RS flip flop circuit 17, the second RS flip flop circuit 18, and the signal output circuit 19 are not illustrated.

FIG. 10 is a time chart illustrating operations of the pulse width modulation circuit 1' according to the second embodiment. Further, in FIG. 10, there is mainly illustrated a time chart regarding signals relating to the first capacitor C1, but the time chart regarding the second set signal set2, the voltage across the second capacitor C2 during charging and discharging, the fourth switching signal φ4, and the output rsout2 are not illustrated.

In the second embodiment, the direction of the changes of the voltages across the first and second capacitors C1 and C2 during the charging and discharging time intervals is made opposite from that in the first embodiment. Namely, while, in the first embodiment, the voltages across the first and second capacitors C1 and C2 are raised from the charging start voltage Va (for example, a voltage slightly lower than the threshold voltage Vth) to the charging end voltage Vc (for example, a voltage in the range of +2.5 to +5.0 [v]) during the charging time intervals, and the voltages across the first and second capacitors C1 and C2 are decreased from the charging end voltage Vc to the threshold voltage Vth (for example, a voltage of +2.5 [v]) during the discharging time intervals, in the second embodiment, the voltages across the first and second capacitors C1 and C2 are decreased from a charging start voltage Vb (for example, a voltage slightly higher than a voltage reference voltage Vref) to a charging end voltage Vc (for example, a voltage in the range of −5.0 to Vref [v]) in the charging time intervals, and the voltages across the first and second capacitors C1 and C2 are raised from the charging end voltage Vc to the reference voltage Vref during the discharging time intervals.

Accordingly, the pulse width modulation circuit 1' according to the second embodiment is different from the pulse width modulation circuit 1 according to the first embodiment, in that the charging-current generation circuit 14, the constant current source 15 for discharging and the current bypass circuit 16 are changed to a discharging-current generation circuit 24, a constant current source 25 for charging, and a current bypass circuit 26 and, also, a first voltage comparator 27 and a second voltage comparator 28 are added between the first capacitor C1 and the first RS flip flop circuit 17 and between the second capacitor C2 and the second RS flip flop circuit 18, respectively.

The current Ih generated by the discharging-current generation circuit 24 is the same as the charging current Ij generated by the charging-current generation circuit 14, but the direction of the current Ih is opposite from that of the charging current Ij. Namely, the discharging-current generation circuit 24 adds the supplemental current Imin to a current IS varying with the amplitude E of the audio signal $e_s$ to generate the discharging current Ih, and the discharging current Ih flows in the direction from the first switch SW1 toward the discharging-current generation circuit 24. Accordingly, the electric charge accumulated in the first capacitor C1 is discharged with the discharging current Ih during a time interval during which the first switch SW1 is ON (a time interval during which the first switching signal φ1 is at the high level).

Further, similarly to the charging-current generation circuit 14, the discharging-current generation circuit 24 also includes a voltage-to-current conversion portion 24a and a supplemental-current generation circuit 24b, but the direction of the output current is opposite and, therefore, the voltage-to-current conversion portion 24a is constituted by an inverting-input type voltage-to-current conversion circuit which employs an OP amplifier 21. Namely, the positive-side input terminal of the OP amplifier 21 is connected to the audio-signal source AU through a resistance device R3 and, also, is connected to the output terminal through a resistance device R1. Further, the positive-side input terminal of the OP amplifier 21 is connected to the positive power supply [+Vcc] through a resistance device R2 to generate a bias voltage for the OP amplifier 21. Further, the OP amplifier 21 is grounded at its negative-side input terminal.

Further, the transistor Q is constituted by an NPN-type transistor and is connected at its emitter terminal to the output terminal of the OP amplifier 21 through a diode D1 and a resistance device R5. Further, the transistor Q is connected at its collector terminal to the switch SW1 and the switch SW2 and is supplied at its base with a negative bias voltage V1 from the voltage supply 22.

Further, the supplemental-current generation portion 24b basically has the same structure as that of the supplemental-current generation portion 14b, but the direction of the flow of the supplemental current Imin is opposite therefrom and, therefore, the power supply has a value of [−Vcc] and, also, the direction of the connection of the diode D1 is opposite therefrom.

The charging constant current source 25 is different from the discharging constant current source 15, only in that it is connected to the positive power supply [+Vcc], and a constant current Id is flowed from the power supply [+Vcc] toward the first and second switches SW1 and SW2. Further, the charging current bypass circuit 26 is different from the charging current bypass circuit 16, in that the polarities of the voltage source 23 and the diode D2 are opposite therefrom.

Accordingly, at a state where the third switch SW3 is OFF, the current Id' (hereinafter, referred to as the "discharging current Id') from the constant current source 25 flows toward the current bypass circuit 26. However, if the third switch SW3 is brought into an ON state, the discharging current Id' is supplied to the first capacitor C1 through the third switch SW3. Similarly, at a state where the fourth switch SW4 is OFF, the current Id' from the constant current source 25 flows toward the current bypass circuit 26. However, if the fourth switch SW4 is brought into an ON state, the discharging current Id' is supplied to the second capacitor C2 through the fourth switch SW4.

In the second embodiment, the time intervals during which the first switching signal φ1 is ON are time intervals during which the first capacitor C1 is discharged, while the time intervals during which the second switching signal φ2 is ON are time intervals during which the second capacitor C2 is discharged. Further, the time intervals during which the first switching signal φ1 is OFF are time intervals during which the first capacitor C1 is charged, while the time intervals during which the second switching signal φ2 is OFF are time intervals during which the second capacitor C2 is charged.

The first voltage comparator 27 detects the timing when the voltage across the first capacitor C1 has risen from the discharging start voltage Vc' to the reference voltage Vref and inputs a signal indicative of the detection, as a first rest signal res1, to the first RS flip flop circuit 17.

The reference voltage Vref is inputted to the positive input terminal of the first voltage comparator 27, while the voltage across the first capacitor C1 is inputted to the negative input terminal thereof. The first voltage comparator 27 outputs, from its output terminal, a signal which is brought into a low level if the voltage across the capacitor C1 exceeds the reference voltage Vref and is brought into a high level if the voltage across the capacitor C1 decreases to below the reference voltage Vref. The signal outputted from the first voltage comparator 27 is inputted to the first RS flip flop circuit 17 and, out of this signal, the signals indicative of the inversion from the high level to the low level become first reset signals res1 for the first RS flip flop circuit 17.

The second voltage comparator 28 detects the timing when the voltage across the second capacitor C2 has risen from the discharging start voltage Vc' to the reference voltage Vref and inputs a signal indicative of the detection, as a second rest signal res2, to the second RS flip flop circuit 18.

The reference voltage Vref is inputted to the positive input terminal of the second voltage comparator 28, while the voltage across the second capacitor C2 is inputted to the negative input terminal thereof. The second voltage comparator 28 outputs, from its output terminal, a signal which is brought into a low level if the voltage across the second capacitor C2 exceeds the reference voltage Vref and is brought into a low level if the voltage across the second capacitor C1 decreases to below the reference voltage Vref. The signal outputted from the second voltage comparator 28 is inputted to the second RS flip flop circuit 18 and, out of this signal, the signals indicative of the inversion from the high level to the low level become second reset signals res2 for the second RS flip flop circuit 18.

The reference voltage Vref in the first and second voltage comparators 27 and 28 functions as a voltage for determining the discharging time interval for the first and second capacitors C1 and C2 and corresponds to the threshold voltage Vth according to the first embodiment. In the second embodiment, similarly to in the first embodiment, there is a time lag from the timing when the third or fourth switching signal φ3 or φ4 is inverted to the high level to the timing when the third or fourth switch SW3 or SW4 is actually turned off. Accordingly, the charging operation with the charging current Id' is continued during the time lag period, which raises the voltage across the first or second capacitor C1 or C2 to the voltage Vb which is slightly higher than the reference voltage Vref. This voltage Vb becomes the discharging start voltage at the next discharging start time interval.

Accordingly, during each discharging time interval, discharging of the first or second capacitor C1 or C2 is started from the discharging start voltage Vb (>Vref).

With the pulse width modulation circuit 1' according to the second embodiment, as illustrated in FIG. 10, if the first switching signal φ1 is inverted to the high level, this causes the first switch SW1 to connect the discharging-current generation circuit 24 to the first capacitor C1, thereby starting discharging the first capacitor C1 with the discharging current Ih from the discharging-current generation circuit 24. This discharging operation is continued until the first switching signal φ1 is inverted to the low level and the first switch SW1 separates the discharging-current generation circuit 24 (see FIGS. 10(a) and (d)). Accordingly, the voltage across the first capacitor C1 is decreased from the discharging start voltage Vb to a discharging end voltage Vc during the ON time interval of the first switching signal φ1 (see FIGS. 10(a) and (d)).

If the first switching signal φ1 is inverted to the low level to cause the transition to a discharging time interval, a first set signal set1 resulted from the detection of this inversion to the low level causes the third switching signal φ3 outputted from the first RS flip flop circuit 17 to be inverted to the high level, which causes the third switch SW3 to connect the constant-current source 25 to the first capacitor C1, thereby starting the charging the first capacitor C1 with the charging current Id' from the constant-current source 25 (see FIGS. 10(a), (c) and (d)).

This charging operation is continued until the voltage across the first capacitor C1 has risen to the reference voltage Vref and, thus, the third switching signal φ3 has been inverted to the low level, thereby causing the third switch SW3 to separate the constant-current source 25 (see FIGS. 10 (b), (e) and (f)).

During each charging time interval, the first RS flip flop circuit 17 outputs, as an output rsout1, a pulse signal which is inverted to the low level at the same timing as the timing when a first set signal set1 is inputted thereto and, then, is inverted to the high level at the same timing as the timing when the voltage across the first capacitor C1 has risen to the reference voltage Vth to cause the first voltage comparator 27 to output a first reset signal res1. Namely, a pulse signal with a pulse width corresponding to the amplitude (the momentary voltage value) of the audio signal $e_s$ is generated (see FIGS. 5(e), (f) and (g)).

The high-level time intervals and the low-level time intervals of the second switching signal φ2 correspond to the discharging time intervals and the charging time intervals for the second capacitor C2, respectively. If the dead time is neglected, the second switching signal φ2 is the same signal as the first switching signal φ1 but has the opposite phase therefrom and, accordingly, the same charging and discharging operations as the charging and discharging operations for the first capacitor C1 are performed for the second capacitor C2, such that they are deviated by the half the period of the first switching signal φ1.

Accordingly, during each charging time interval for the second capacitor C2, the second RS flip flop circuit 18 outputs, as an output rsout2, a pulse signal which is inverted to the low level at the same timing as the timing when a second set signal set2 is inputted thereto and, then, is inverted to the high level at the same timing as the timing when the voltage across the second capacitor C2 has risen to the reference voltage Vref to cause the second voltage comparator 28 to output a second reset signal res2.

The signal output circuit 19 synthesizes the output rsout1 and the output rsout2 outputted from the first and second flip flop circuits 17 and 18 and output the signal resulted from the synthesis, as a pulse-width modulated signal PWMout (a signal generated by synthesizing the waveform of the output rsout1 and the waveform of the output rsout2) (see FIG. 10(h)).

In the second embodiment, when the amplitude of the audio signal $e_s$ varies within the normal range (the range of −Es to +Es), the voltage across the first or second capacitor C1 or C2 is certainly decreased to the discharging end voltage Vc' which is lower than the reference voltage Vref during each discharging time interval. Accordingly, even after the transition to the charging time interval, the voltage across the first or second capacitor C1 or C2 normally becomes the charging start voltage Vb, which can maintain the voltage across the first or second capacitor C1 or C2 at the discharging start voltage Vb after the charging is stopped. This can stabilize, at Vb, the discharging start voltage across the first or second capacitor C1 or C2, in each charging time interval.

When the amplitude of the audio signal $e_s$ varies within a positively-excessive range (a range equal to or larger than +Es), similarly to when the amplitude of the audio signal eS varies within the normal range (the range from −Es to +Es), the voltage across the first or second capacitor C1 or C2 is certainly decreased to a discharging end voltage Vc' which is lower than the reference voltage Vref during each discharging time interval (see a voltage waveform N3 in FIG. 10(d)). Accordingly, the voltage across the first or second capacitor C1 or C2 is certainly maintained at the discharging start voltage Vb after the stop of charging. This can stabilize, at Vb, the discharging start voltage across the first or second capacitor C1 or C2, in each discharging time interval.

Further, similarly, when the amplitude of the audio signal $e_s$ varies within a negatively-excessive range (a range equal to or smaller than −Es), the first or second capacitor C1 or C2 is certainly discharged with the supplemental current Imin, until the voltage across it is decreased to the reference voltage Vref, during each discharging time interval. Accordingly, even after the transition to the charging time interval, the voltage across the first or second capacitor C1 or C2 normally becomes the charging start voltage Vb. This prevents both the input terminals of the first and second RS flip flop circuits 17 and 18 from being brought into the low level at the time when first and second set signals set1 and set2 are inputted to the first and second RS flip flop circuits 17 and 18, which prevents stepwise increases of the discharging start voltages across the first and second capacitors C1 and C2 from Vb, thereby maintaining, anytime, the discharging start voltage Vb until the next discharging time interval. This can stabilize, at Vb, the discharging start voltages across the first and second capacitors C1 and C2, in the discharging time intervals (see a voltage waveform N4 in FIG. 10(d)).

Accordingly, with the pulse width modulation circuit 1' according to the second embodiment, it is possible to offer the same effects as those of the pulse width modulation circuit 1 according to the first embodiment.

Further, in the second embodiment, similarly, the discharging-current generation circuit 24 can be deformed as illustrated in FIG. 8. Namely, the supplemental-current generation portion 24b can be eliminated from the discharging-current generation circuit 24, and a constant current source can be connected to the collector terminal (the output terminal) of the transistor Q, such that the supplemental current Imin from the constant current source is flowed toward the negative power supply.

As a matter of cause, the scope of the present invention is not limited to the aforementioned embodiments. Namely, the circuit structures illustrated in the aforementioned embodiments are merely illustrative, and various types of circuits can be employed, provided that these circuits have functions equivalent to those of the circuits illustrated in the aforementioned embodiments.

For example, a state where the amplitude of the audio signal $e_s$ varies within a negatively-excessive range (a range equal to or smaller than $-Es$) can be detected and, during the detection, in the first embodiment, the charging-current generating circuit 14 can be electrically separated from the first and second capacitors C1 and C2, and the circuit for supplying the supplemental current Imin can be connected thereto and, further, in the second embodiment, the supplemental-current generation circuit 24b can be electrically separated from the first and second capacitors C1 and C2, and the circuit for supplying the supplemental current Imin can be connected thereto.

What is claimed is:

1. A pulse width modulation circuit comprising:
    a reference-clock generator which generates a reference clock;
    a first electric-charge accumulator which accumulates an electric charge;
    a second electric-charge accumulator which accumulates an electric charge;
    a first current generator which generates, from an input AC voltage, a first current with a current value varying with the amplitude of this AC voltage;
    a second current generator which generates a second current with a constant current value;
    a first current supply controller which, during high-level half cycles of said reference clock, supplies said first current to said first electric-charge accumulator during the high-level time intervals, in order to change the voltage across said first electric-charge accumulator from a first voltage to a second voltage corresponding to the amplitude of said AC voltage;
    a second current supply controller which, during low-level half cycles subsequent to the half cycles during which said first current is supplied, supplies said second current to said first electric-charge accumulator, in the opposite direction from that of said first current, until a predetermined time is elapsed after the voltage across the first electric-charge accumulator is changed from said second voltage to a predetermined threshold value between the second voltage and said first voltage;
    a first pulse-signal generator which, during the low-level half cycles subsequent to the half cycles during which said first current is supplied, generates pulse signals with a pulses width corresponding to the time interval required for changing the voltage across said first electric-charge accumulator from said second voltage to said threshold voltage;
    a third current supply controller which, during the low-level half cycles of said reference clock, supplies said first current to said second electric-charge accumulator during the low-level time intervals, in order to change the voltage across said second electric-charge accumulator from said first voltage to said second voltage;
    a fourth current supply controller which, during the high-level half cycles subsequent to the half cycles during which said first current is supplied, supplies said second current to said second electric-charge accumulator, in the opposite direction from that of said first current, until said predetermined time is elapsed after the voltage across the second electric-charge accumulator is changed from said second voltage to said threshold value;
    a second pulse-signal generator which, during the high-level half cycles subsequent to the half cycles during which said first current is supplied, generates pulse signals with a pulses width corresponding to the time interval required for changing the voltage across said second electric-charge accumulator from said second voltage to said threshold voltage; and
    a pulse modulated signal generator which synthesizes the pulse signals generated by said first pulse-signal generator and the pulse signals generated by said second pulse-signal generator to generate a pulse-width modulated signal;
    wherein there is provided a current limiter which limits the first current generated by said first current generator to a third current with a predetermined current value, if the amplitude of said AC voltage in the negative side exceeds a predetermined level.

2. A switching amplifier comprising;
    the pulse width modulation circuit according to claim 1;
    a voltage source which outputs a predetermined reference power supply voltage; and
    a switching circuit which switches said reference power supply voltage supplied from said voltage source, on the basis of modulated signals outputted from said pulse width modulation circuit.

3. The pulse width modulation circuit according to claim 1, wherein said first and second electric-charge accumulator are discharged with said first current by said first current supply controller and are charged with said second current by said second current supplier.

4. The pulse width modulation circuit according to claim 1, wherein said first and second electric-charge accumulator are charged with said first current by said first current supply controller and are discharged with said second current by said second current supplier.

5. The pulse width modulation circuit according to claim 1, wherein said first current generator is constituted by a voltage-to-current conversion circuit which employs an operational amplifier, and said current limiter is constituted by a supplemental-current supply circuit which is connected to an output end of said voltage-to-current conversion circuit and adds said third current to the current outputted from the voltage-to-current conversion circuit, and by a switch circuit which electrically separates said voltage-to-current conversion circuit if the amplitude of said AC voltage at its negative side exceeds said predetermined value.

6. The pulse width modulation circuit according to claim 3, wherein
    said first pulse-signal generator is constituted by a first RS flip flop circuit adapted such that a signal resulted from the detection of the timing when said reference clock is inverted from the high level to the low level is inputted thereto as a first set signal, and a signal resulted from the fact that the voltage across said first electric-charge accumulator has reached said threshold voltage is inputted thereto as a first reset signal, said threshold voltage being set as a threshold voltage for the logic levels, and
    said second pulse-signal generator is constituted by a second RS flip flop circuit adapted such that a signal resulted from the detection of the timing when said reference clock is inverted from the low level to the high level is inputted thereto as a second set signal, and a signal resulted from the fact that the voltage across said second electric-charge accumulator has reached said threshold voltage is inputted thereto as a second reset signal, said threshold voltage being set as a threshold voltage for the logic levels.

7. A pulse width modulation circuit comprising:
    a reference-clock generator which generates a reference clock;

a first electric-charge accumulator which accumulates an electric charge;

a second electric-charge accumulator which accumulates an electric charge;

a first current generator which generates, from an input AC voltage, a first current with a current value varying with the amplitude of this AC voltage;

a second current generator which generates a second current with a constant current value;

a first current supply controller which, during high-level half cycles of said reference clock, supplies said first current to said first electric-charge accumulator during the high-level time intervals, in order to change the voltage across said first electric-charge accumulator from a first voltage to a second voltage corresponding to the amplitude of said AC voltage;

a second current supply controller which, during low-level half cycles subsequent to the half cycles during which said first current is supplied, supplies said second current to said first electric-charge accumulator, in the opposite direction from that of said first current, until a predetermined time is elapsed after the voltage across the first electric-charge accumulator is changed from said second voltage to a predetermined threshold value between the second voltage and said first voltage;

a first pulse-signal generator which, during the low-level half cycles subsequent to the half cycles during which said first current is supplied, generates pulse signals with a pulses width corresponding to the time interval required for changing the voltage across said first electric-charge accumulator from said second voltage to said threshold voltage;

a third current supply controller which, during the low-level half cycles of said reference clock, supplies said first current to said second electric-charge accumulator during the low-level time intervals, in order to change the voltage across said second electric-charge accumulator from said first voltage to said second voltage;

a fourth current supply controller which, during the high-level half cycles subsequent to the half cycles during which said first current is supplied, supplies said second current to said second electric-charge accumulator, in the opposite direction from that of said first current, until said predetermined time is elapsed after the voltage across the second electric-charge accumulator is changed from said second voltage to said threshold value;

a second pulse-signal generator which, during the high-level half cycles subsequent to the half cycles during which said first current is supplied, generates pulse signals with a pulses width corresponding to the time interval required for changing the voltage across said second electric-charge accumulator from said second voltage to said threshold voltage; and a pulse modulated signal generator which synthesizes the pulse signals generated by said first pulse-signal generator and the pulse signals generated by said second pulse-signal generator to generate a pulse-width modulated signal;

wherein there is provided a current limiter which limits the first current generated by said first current generator to a third current with a current value which changes the voltages across said first and second electric-charge accumulator at least from said first voltage to said threshold voltage, if the amplitude of said AC voltage in the negative side exceeds a predetermined level.

8. A switching amplifier comprising;

the pulse width modulation circuit according to claim 7;

a voltage source which outputs a predetermined reference power supply voltage; and a switching circuit which switches said reference power supply voltage supplied from said voltage source, on the basis of modulated signals outputted from said pulse width modulation circuit.

9. The pulse width modulation circuit according to claim 7, wherein said first and second electric-charge accumulator are charged with said first current by said first current supply controller and are discharged with said second current by said second current supplier.

10. The pulse width modulation circuit according to claim 7, wherein said first and second electric-charge accumulator are discharged with said first current by said first current supply controller and are charged with said second current by said second current supplier.

11. The pulse width modulation circuit according to claim 10, wherein said first pulse-signal generator is constituted by a first RS flip flop circuit adapted such that a signal resulted from the detection of the timing when said reference clock is inverted from the high level to the low level is inputted thereto as a first set signal, and a signal resulted from the fact that the voltage across said first electric-charge accumulator has reached said threshold voltage is inputted thereto as a first reset signal, said threshold voltage being set as a threshold voltage for the logic levels, and said second pulse-signal generator is constituted by a second RS flip flop circuit adapted such that a signal resulted from the detection of the timing when said reference clock is inverted from the low level to the high level is inputted thereto as a second set signal, and a signal resulted from the fact that the voltage across said second electric-charge accumulator has reached said threshold voltage is inputted thereto as a second reset signal, said threshold voltage being set as a threshold voltage for the logic levels.

* * * * *